United States Patent [19]
Hattori et al.

[11] Patent Number: 5,546,327
[45] Date of Patent: Aug. 13, 1996

[54] APPARATUS FOR CALCULATING GEOMETRICAL VIEW FACTOR

[75] Inventors: Yoshihiro Hattori, Osaka; Sachio Nagamitsu, Kyoto; Yoichi Nagata, Neyagawa; Hisashi Kodama, Ikoma, all of Japan

[73] Assignee: Matsushita Electric Industrial Co., Ltd., Osaka, Japan

[21] Appl. No.: 273,212

[22] Filed: Jul. 11, 1994

Related U.S. Application Data

[63] Continuation-in-part of Ser. No. 810,511, Dec. 19, 1991, abandoned.

[30] Foreign Application Priority Data

Dec. 27, 1990 [JP] Japan .................................. 2-416226
Mar. 15, 1991 [JP] Japan .................................. 3-51000
Mar. 15, 1991 [JP] Japan .................................. 3-51001

[51] Int. Cl.$^6$ .................................................. G01N 21/00
[52] U.S. Cl. .......................... 364/556; 364/559; 364/516; 364/578; 364/731
[58] Field of Search .................................. 364/556, 731, 364/559, 516, 578; 395/120, 123, 126, 129; 374/126, 130; 356/43; 250/334, 227, 293, DIG. 1, 342

[56] References Cited

U.S. PATENT DOCUMENTS

| | | | |
|---|---|---|---|
| 4,387,365 | 6/1983 | Berry et al. | 364/731 |
| 4,498,765 | 2/1985 | Herve | 356/43 |
| 4,709,231 | 11/1987 | Sakaibara et al. | 395/126 |
| 4,719,585 | 1/1988 | Cline et al. | 395/124 |
| 4,835,712 | 5/1989 | Drebin et al. | 395/123 |
| 5,083,287 | 1/1992 | Obata et al. | 395/126 |
| 5,305,430 | 4/1994 | Glassner | 395/126 |
| 5,313,542 | 5/1994 | Castonguay | 250/227.28 |
| 5,313,568 | 5/1994 | Wallace et al. | 395/126 |

OTHER PUBLICATIONS

Nobuyuki Takeya et al., "Study About Numerical Estimate of Airflow and Thermal Distribution in Room", *Scientific Lecture Papers*, pp. 1161–1164, (Sep. 1, 1990), (including partial English translation).

H. Hayasaka et al., "A Direct Simulation Method for the Analysis of Radiative Heat Transfer in Furnaces", *Heat Transfer in Furnaces*, pp. 59–63 (Aug. 1987).

Takeshi Ikushima et al., "Thermal Radiation View Factor Calculation Using Monte Carlo Method", *Japan Atomic Energy Society*, pp. 64–72 (1988), (including English abstract).

Tetsumi Horikoshi et al., "Configuration Factors between Cylindrical Element as a Model of the Human Body and a Ractangular Plane", *Ann. Physiol. Anthrop.*, pp. 143–150, (1988), (including English abstract).

R. F. Babus'Haq et al., "Geometric View Factors for Radiation Exchanges between an Infinitely Long Cylinder and a Parallel Infinitely Long Enclosure of Either Cylindrical or Rectangular Cross–Section", *Applied Energy*, vol. 23, No. 4, pp. 307–313 (1986).

D. Burgoon, "Global Illumination Modeling Using Radiosity", *Hewlett–Packard Journal*, vol. 40, No. 6, pp. 78–88 (Dec. 1989).

*Primary Examiner*—Emanuel T. Voeltz
*Assistant Examiner*—Hal P. Wachsman
*Attorney, Agent, or Firm*—Ratner & Prestia

[57] ABSTRACT

The zenithal angle of a spherical surface is divided at regular intervals, the horizontal angle thereof is also divided at regular intervals in correspondence with each of the zenithal angles, and in addition, the intensity of each energy line emitted from the center of the bottom surface of the spherical surface at the divided zenithal and horizontal angles corresponds to each zenithal angle. Thus, the energy lines can be isotropically emitted from the center of the bottom surface the spherical surface. The emitted energy lines are traced from the center to each object surface and the intensity of each energy line which has reached each object surface are added to each other. Then, the intensity obtained by the addition is divided by the intensity of entire energy lines emitted from the center. Thus, the geometrical view factor of each object surface can be found quickly and accurately.

4 Claims, 22 Drawing Sheets

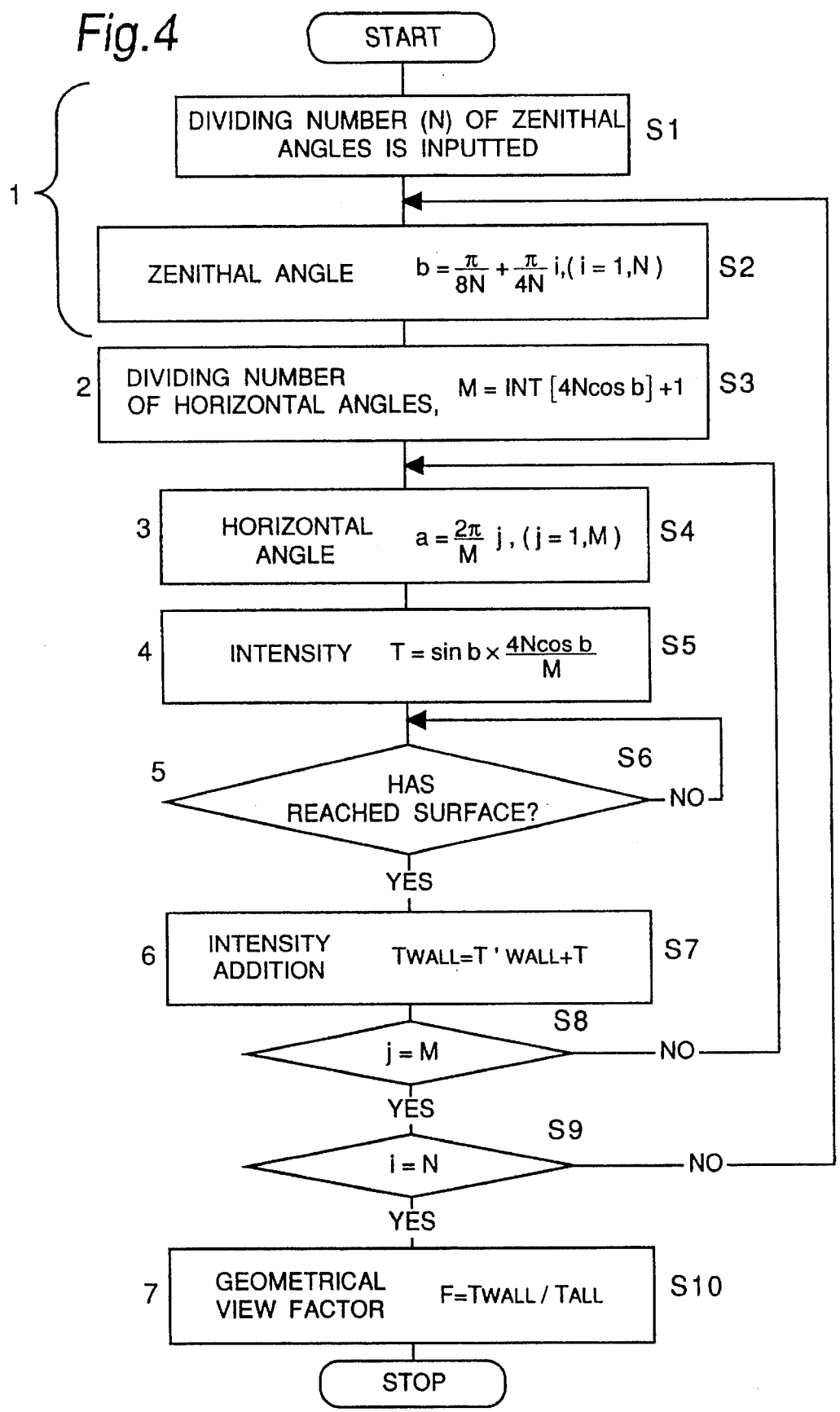

NUMBER OF
BOUNDARY COORDINATE  1  2  3  4  5  6
         MESH NUMBER 1  2  3  4  5  6 7

RECTANGULAR SURFACE

APPARATUS FOR CALCULATING GEOMETRICAL VIEW FACTOR

This application is a continuation-in-part patent application of prior patent application Ser. No. 07/810,511 filed on Dec. 19, 1991, now abandoned.

BACKGROUND OF THE INVENTION

The present invention relates to an apparatus for calculating a geometrical view factor in performing a calculation about radiant heat.

The present invention relates to an apparatus for calculating the geometrical view factor of a rectangular surface required in performing a calculation quickly and accurately about radiation heat in a three-dimensional region.

The present invention relates to an apparatus for finding a geometrical view factor between a cylindrical surface and a rectangular surface in performing a calculation about radiant heat.

In recent years, radiant air conditioners, for example, a floor heating apparatus and a panel cooling and heating of a ceiling has been developed. In order to develop this kind of floor heating apparatus, it is necessary to know the magnitude of radiant heat applied to the wall of a room in which the floor heating apparatus is installed. In order to calculate the radiant heat, it is necessary to find a geometrical view factor which depends on the angular or positional relationship between the floor heating apparatus and an object, for example, the wall of the room. As a method for finding the geometrical view factor, energy lines are emitted from a point of the floor heating apparatus to a wall to be radiantly heated and the number of energy lines which have reached the wall are counted. The conventional apparatus for calculating the geometrical view factor is constructed as shown in FIG. 16. The operation of the apparatus is described below. A hemispherical surface is assumed around the point of the floor heating apparatus. Zenithal angle calculating means 11 generates random numbers in the zenithal angle direction of the spherical surface to find a zenithal angle of the spherical surface. Horizontal angle calculating means 13 generates random numbers in the horizontal angle direction of the spherical surface to find a horizontal angle of the spherical surface. Arrival deciding means 15 decides whether or not an energy line having the decided zenithal angle and horizontal angle reaches a surface of an object. Based on the number of emitted energy lines, arrival intensity adding means 16 calculates the intensities of energy lines at the surface which they have reached. Geometrical view factor calculating means 17 finds the ratio of the intensities of all emitted energy lines to find a geometrical view factor. Refer to a magazine entitled as "Thermal Radiation View Factor Calculation Using Monte Carlo Method, Comparison of Accuracy and Computer Time with Area Integration Method" written by Takeshi IKUSHIMA and et al. and published by Japan Atomic Society, 1988, Vol. 30, No. 6, page 64–page 70.

FIG. 17 is an image view showing a method for generating energy lines by utilizing random numbers so as to calculate the number of energy lines which have reached each surface.

However, according to the above-described conventional method, since random numbers are utilized, energy lines emitted from a certain point of an energy source are not necessarily emitted isotropically toward a hemisphere, which means that the number of energy lines cannot be accurately calculated when a small number of energy liens are emitted from the emission point. If many energy lines are emitted therefrom, it takes long to perform a calculation.

According to the conventional method, a geographical view factor between rectangular surfaces is found as follows: The rectangular surface of a three-dimensional region are divided as shown in FIG. 18; energy lines each having an intensity are emitted from a divided rectangular surface of the floor of the region energy source in various directions; the intensity of each energy line which has reached an object rectangular surface of a solid wall of the region is calculated; and the ratio of the intensities of energy lines which have reached the object rectangular surface of the solid wall to the intensity obtained by adding the intensities of all energy lines emitted from the divided rectangular surface is found and then the geometrical view factor between the divided rectangular surface of the floor and the object rectangular surface of the solid wall is founded (Papers of lectures given at meeting of Air Conditioning Sanitary Engineering Society, 1990, page 1161 through 1164). Supposing that the emitted energy lines reach the object rectangular surface of the solid wall directly, arrival positions of energy lines are calculated.

However, according to the above conventional method, in a space such as a room accommodating a furniture or a furnishing as shown in FIG. 19, an accurate geographical view factor cannot be obtained because it is assumed that the emitted energy lines directly reach the surface of the solid wall and then the existence of the furniture is not considered. In analyzing hot air flow in the room, the space is divided with fine mesh as shown in FIG. 9. In order to quickly trace an energy line in the space which is regarded as not absorbing radiation heat, it is necessary to regenerate meshes by an element which constitutes a solid body which absorbs radiant heat as shown in FIG. 10.

When the transmission of radiant heat from air conditioning equipments such as a floor heating equipment, a panel cooling and heating of a ceiling, or the like is calculated, it is necessary to find a geographical view factor which is determined according to an angle and a position. Specially, it is necessary to find a geographical view factor between a human body and a rectangular surface in order to calculate the transmission of radiant heat between the human body and a radiant wall. In such calculations, a model is considered as the human body in order to perform the calculations. Conventionally, the human body is regarded as a microelement to find the geographical view factor between the micro-cylinder and the rectangular surface as shown in FIG. 20. This method is described in a magazine of "Ann. Physiological Anthrop." published in 1988, in 7(3), on pages 143 through 150. In order to find the geographical view factor, an area integration equation is used by finely dividing the cylindrical surface and the rectangular surface.

However, according to the conventional art, it takes a long period of time for calculations to be performed because cylindrical and rectangular surfaces must be finely divided. In addition, it is necessary to limit an integration range if another rectangular surface is interposed between the cylindrical surface and the rectangular surface. Thus, accurate calculations cannot be performed. Further, in performing calculation, attention is not paid to the actual dimensions of the human body. Therefore, the influence of radiant heat from the rectangular surface to the human body is not correctly calculated.

SUMMARY OF THE INVENTION

It is an object of the present invention to provide an apparatus for calculating a thermal radiant geometrical view factor accurately and quickly.

It is an object of the present invention to provide an apparatus for tracing emitted energy lines accurately and quickly.

It is an object of the present invention to provide an apparatus for finding the geographical view factor between a cylindrical surface and a rectangular surface accurately and quickly.

In accomplishing these and other objects, according to one aspect of the present invention, there is provided a computer-based apparatus for calculating a geometrical view factor between a spherical surface and an object surface when energy is emitted from a center of the spherical surface to the object surface in a region where a solid surface in which heat energy is transferred is existed, comprising:

an input device for inputting a three dimensional coordinate in the region to be calculated, and a position of the object surface;

an input control part for controlling numerical values inputted by the input device;

a storage device for storing three dimensional coordinate data;

a CPU with a processing part for calculating the geometrical view factor including a ratio of received heat for each surface where heat of energy lines is received after the energy lines are emitted from an emission point based on the inputted numerical values;

a display control part for controlling display of result calculated by the processing part;

a display for displaying the calculated geometrical view factor through the display control part, the processing part including:
a zenithal angle calculating parts for dividing the spherical surface at regular intervals so as to uniformly emit the energy line from the spherical surface, calculating a zenithal angle, and then storing the calculated zenithal angle into the storage device;

a horizontal angle dividing number calculating part for calculating a horizontal angle dividing number in correspondence with the stored zenithal angle;

a horizontal angle calculating part for dividing a horizontal angle based on the calculated horizontal angle dividing number, calculating a horizontal angle, and then storing the calculated horizontal angle in the storage device;

an emission intensity calculating part for calculating an intensity in correspondance with the calculated horizontal angle;

an arrival surface detecting part for emitting from the center of spherical surface the energy line passing through a point determined by the calculated zenithal and horizontal angles and having the calculated intensity, and then detecting a next arrival surface;

an intensity adding part for adding to each other the intensity of the arrived heat energy of the energy line for each solid surface where the energy line has been arrived; and a geometrical view factor calculating part for finding a ratio of the emitted entire energy and the arrival intensity after all of the energy lines are emitted, and then setting the ratio as the geometrical view factor, the geometrical view factor being stored in the storage device as geometrical view factor data.

Further provided is a computer-based apparatus for calculating a geometrical view factor between a hemispherical surface formed on a face of a solid surface and an object surface when energy is emitted from a center of the hemispherical surface to the object surface in a region where the solid surface in which heat energy is transferred is existed, comprising:

an input device for inputting a three dimensional coordinate in the region to be calculated, a position of a heat source which causes the heat to be transferred, a position of the solid surface, a position and a value of heat physical property of a solid body existing in the region;

an input control part for controlling numerical values inputted by the input device;

a processing part for calculating the geometrical view factor based on the controlled numerical values;

a mesh generating part for generating meshes with three dimensional coordinates for being processed by the processing part;

a storage device for storing three dimensional coordinate data of the meshes generated by the mesh generating part, heat source data of the heat source, and heat physical property value data of the value of the heat physical property;

the processing part including:
a mesh re-constructing part for re-constructing the three dimensional coordinates of the meshes generated by the mesh generating part, in consideration of physical property for each mesh;

an emission point calculating part for determining a coordinate of an emission point for emitting energy from the heat source based on the heat source data;

an emission control part for calculating angles and intensities of heat energy lines so as to uniformly emit the heat energy lines on the hemispherical surface for each emission point;

an arrival surface detecting part for detecting a solid where the lines are reached from the emission point;

the arrival surface detecting part including:
a moving point determining part for determining the emission point as a moving point;

a moving point-to-mesh boundary distance calculating part for finding distances between the moving point in three-dimension and subsequent mesh boundaries in three-dimensional directions;

a moving point-to-mesh boundary arrival point distance calculating part for calculating a distance between the moving point and an arrival point where the energy lines from the moving point are arrived to each mesh boundary in each of the three directions determined by the calculated zenithal and horizontal angles stored in the storage device;

a distance comparing and deciding part for comparing the distances in the three directions calculated by the moving point-to-mesh boundary arrival point distance calculating part with each other and then selecting a minimum distance from the compared distances;

an arrival point coordinate calculating part for calculating a coordinate of the arrival point relating to the minimum distance; and a surface deciding part for deciding whether or not the mesh coordiante calculated by the arrival point coordinate calculating part is included in the solid surface based on the physical properties for each mesh stored in the storage device, wherein if the surface deciding part decides that the mesh coordinate calculated by the arrival point coordinate calculating part is not included in the solid surface, the moving point determining part determines the arrival point as a moving point so as to repeatedly operate the moving point-to-mesh boundary distance calculating part, the moving point-to-mesh boundary arrival point distance calculating part, the distance comparing and deciding part, the arrival point coordinate calculating part, and the surface deciding part decides that the mesh coordinate calculated by the arrival point coordinate calculating part is included in the solid surface;

an intensity adding part for adding to each other intensities of arrival heat energy for each of the solid surfaces where the energy lines are arrived; and a geometrical view factor calculating part for finding a ratio between emitted entire energy and arrival intensity after all energy lines are emitted from the heat source, and then setting the ratio as a geometrical factor;

a display control part for controlling display of result calculated by the processing part; and a display for displaying the calculated geometrical view factor through the display control part.

According to the apparatus, the zenithal angle of a spherical surface is divided at regular intervals, the horizontal angle thereof is also divided at regular intervals in correspondence with each of the zenithal angles, and in addition, the intensity of each emitted energy line corresponds to each zenithal angle. Thus, the energy lines can be isotropically emitted from the center of the bottom surface of the spherical surface. The emitted energy lines are traced from the emission point to each object surface and the intensity of each energy line which has reached each object surface are added to each other. Then, the intensity obtained by the addition is divided by the intensity of entire energy lines emitted from the emission point. Thus, the geometrical view factor of each surface can be found quickly and accurately.

BRIEF DESCRIPTION OF THE DRAWINGS

These and other objects and features of the present invention will become apparent from the following description taken in conjunction with the preferred embodiments thereof with reference to the accompanying drawings, in which:

FIG. 4 is a flowchart showing the operation of the first embodiment;

DETAILED DESCRIPTION OF THE INVENTION

Figure 1:
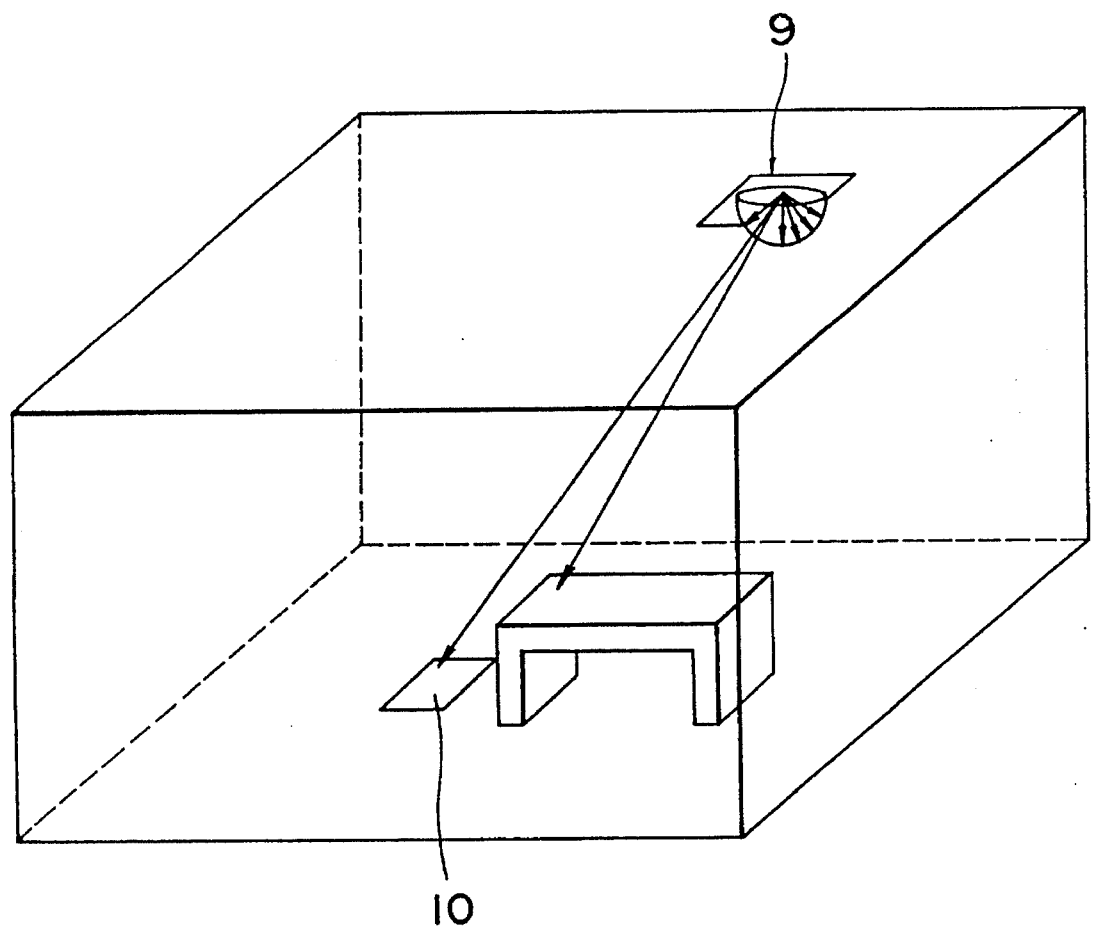
FIG. 1 is a perspective view showing an indoor space to find a geometrical view factor according to the first embodiment of the present invention.

Before the description of the present invention proceeds, it is to be noted that like parts are designated by like reference numerals throughout the accompanying drawings.

Referring to drawings, the embodiments of the present invention are described below.

Figure 2:
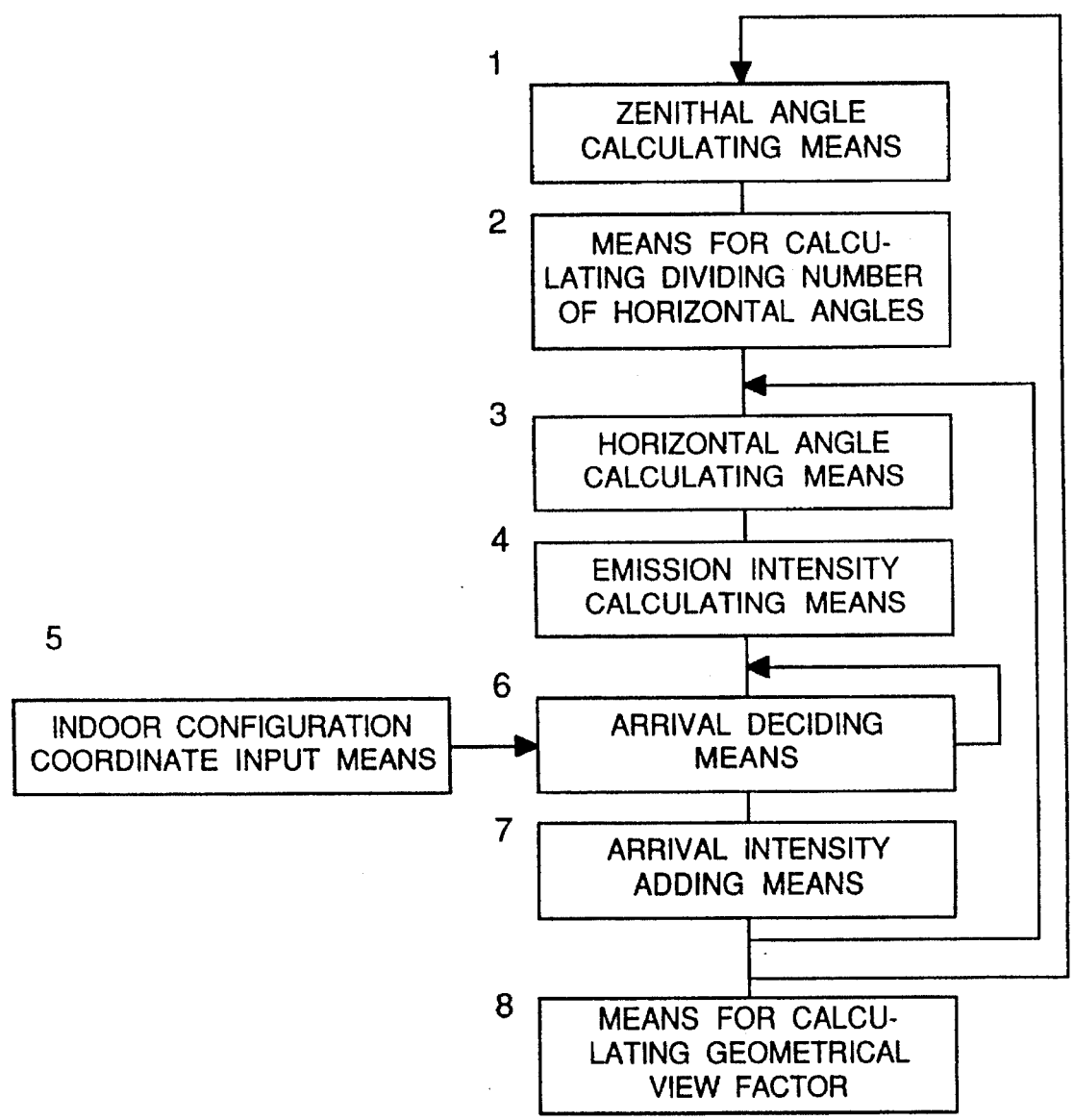
FIG. 2 is a block diagram showing the construction of an apparatus for calculating a geometrical view factor according to the first embodiment of the present invention.

FIG. 1 is a perspective view showing an indoor space provided to find a geometrical view factor according to an embodiment of the present invention. In this embodiment, an energy source 9 such as a heat source or a light source is provided on the ceiling so that what percentage the energy generated by the energy source reaches a divided object rectangular surface of the floor, namely, the geometrical view factor between the energy source and the object area is calculated. A hemispherical surface is assumed around the emission point of the energy source 9. FIG. 2 is a block diagram showing the construction of an apparatus for calculating the geometrical view factor. The apparatus comprises zenithal angle calculating means 1, means 2 for calculating dividing number of horizontal angle, horizontal angle calculating means 3, emission intensity calculating means 4, indoor configuration coordinate input means 5, arrival deciding means 6, arrival intensity adding means 7, and means 8 for calculating geometrical view factor.

Figure 3A:
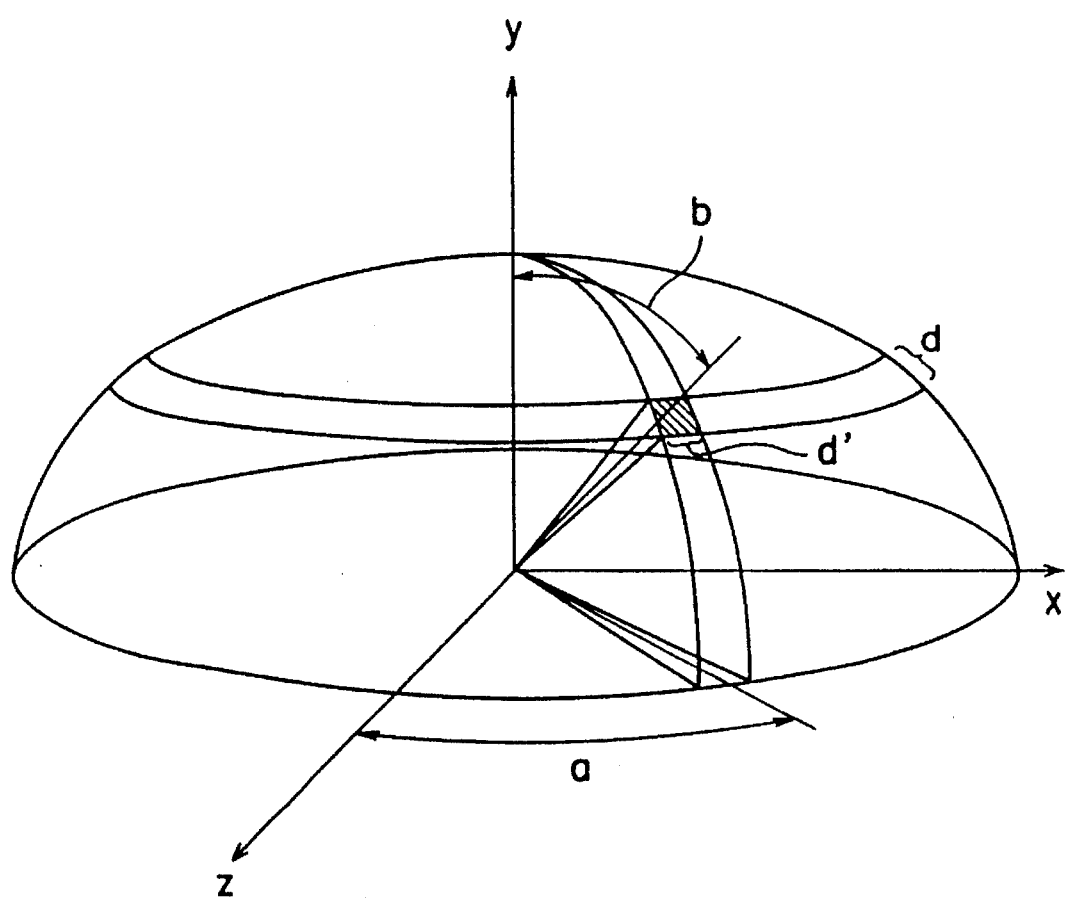
FIG. 3A is a schematically perspective view showing the operation for dividing the hemispherical surface in the apparatus according to the first embodiment of the present invention.

The zenithal angle calculating means 1 determines a zenithal angle of the hemispherical surface by dividing the hemispherical surface in its zenithal angle direction at equal intervals. The horizontal angle calculating means 2 calculates the dividing number of the horizontal angle of the hemispherical surface corresponding to the zenithal angle determined by the zenithal angle calculating means 1. The horizontal angle calculating means 3 calculates the horizontal angle by dividing the horizontal angle into the dividing number of the horizontal angle determined by the horizontal angle calculating means 2. The emission intensity calculating means 4 calculates an intensity corresponding to the zenithal angle determined by the horizontal angle calculating means 3. The indoor configuration coordinate input means 5 inputs the coordinate of the configuration of a room including the position of a furniture such as a desk or furnishings. The deciding means 6 decides whether or not an energy line emitted from the center of the bottom surface the hemispherical surface at the above intensity reaches an object surface corresponding to the zenithal angle and the horizontal angle determined by the zenithal angle calculating means 1 and the horizontal angle calculating means 3, respectively. The intensity adding means 7 adds to each other the intensities of energy lines which have reached each object rectangular surface based on the result obtained by the decision made by the input means 5. The geometrical view factor calculating means 8 calculates a geometrical view factor based on the intensity obtained by the addition performed by the deciding means 6. As shown in FIG. 3A, the zenithal angle (b) is an angle which a perpendicular drawn from an emission point to the hemispherical surface forms with y-axis, and the horizontal angle (a) is an angle which a line emitted from the emission point to a given point on the hemispherical surface forms with z-axis.

FIG. 4 is a flowchart showing the operation of the apparatus. First, at step S1, the dividing number (N) of the zenithal angle is inputted. At step S2, the zenithal angle (b) is found by the following equation (1) supposing that (i) is an integer in the range from 1 to N:

$$b=\pi/(8N)+\pi/(4N)*i \quad (1)$$

At step S3, the dividing number (M) of the horizontal angle (a) is found by the following equation (2) as an integer corresponding to the zenithal angle (b):

$$M=INT[4N \sin b] \quad (2)$$

At step S4, based on the dividing number (M) of the horizontal angle (a), the horizontal angle (a) is found from the following equation (3) supposing that (j) is an integer in the range from 1 to M:

$$a=2\pi/M*j \quad (3)$$

The above calculation is described in terms of the length of a dividing line with reference to FIG. 3A. If the zenithal angle (b) is found, the length (d) of the dividing line in the zenithal angle direction is determined. Then, in order to approximate a length (d') in the horizontal direction to the length (d), the circumference in the horizontal direction formed by connecting points on the hemispherical surface which forms the zenithal angle (b) is divided by the length (d). It is assumed that the quotient is (M). If the length (d) does not exactly divide the circumference, the circumference in the horizontal direction is divided by (M+1), with the circumference (M+1) set as a dividing number in the horizontal direction. Consequently, the quotient (d') is obtained. Alternately, the following method may be performed: If the remainder of the division of the circumference by the length (d) is 0.5 or more, the dividing number is set as (M+1). If the remainder of the division of the circumference by the length (d) is less than 0.5, the dividing number is set as (M). Thus, the length (d') of a line in the horizontal direction dividing the circumference can be found. Thus, the horizontal angle (a) is determined.

At step S5, considering the Lambert's cosine law and that the number of energy lines which have reached each hemispherical surface is expressed as an integer, the intensity (T) of the entire energy lines is corrected by the following equation (4):

$$T=\cos b*4N \sin b/M' \quad (4)$$

where M' is the dividing number in the horizontal direction actually used.

At step S6, based on the horizontal angle (a), the zenithal angle (b), and the coordinate of the indoor configuration, the three-dimensional coordinate of each energy line is geometrically traced until each energy line reaches the object surface of a solid body. When each energy line has reached the object surface of the solid body, it is decided where the energy line has reached, for example, part of the floor surface, the surface of table, or the like. Then, the intensities (T) of the energy lines which have reached each surface are added to each other based on the following equation (5) at step S7.

$$T_{WALL}=T'_{WALL}+T \quad (5)$$

In the equation (5), when the intensity (T) of the energy line is firstly found, the value ($T'_{WALL}$) is zero and then in the equation (5), $T_{WALL}=T$. Then, when the intensity (T) of the energy line is secondly found, the firstly found intensity value ($T_{WALL}$) is substituted in the equation (5) as a value ($T'_{WALL}$) and then the firstly found intensity ($T'_{WALL}$) and the now found intensity (T) are added to each other to find the new intensity ($T_{WALL}$).

Then, at step S8, (j) is increased by "1" and then the horizontal angle (a) is changed to carry out the operations of steps S4 through S7 again. At step S9, after (j) takes the value "1" through (M) at step S8, (i) is increased by "1" and then the zenithal angle (b) is changed to perform the operation of steps S2 through S8. At step S10, after (i) takes the value "1" through (N) at step S9, the intensity ($T_{WALL}$) of each surface obtained by the addition is divided by the entire intensity ($T_{ALL}$) of the emission hemispherical surface so as to find a geometrical view factor (F) from the following equation (6):

$$F=T_{WALL}/T_{ALL} \quad (6)$$

Figure 3B:
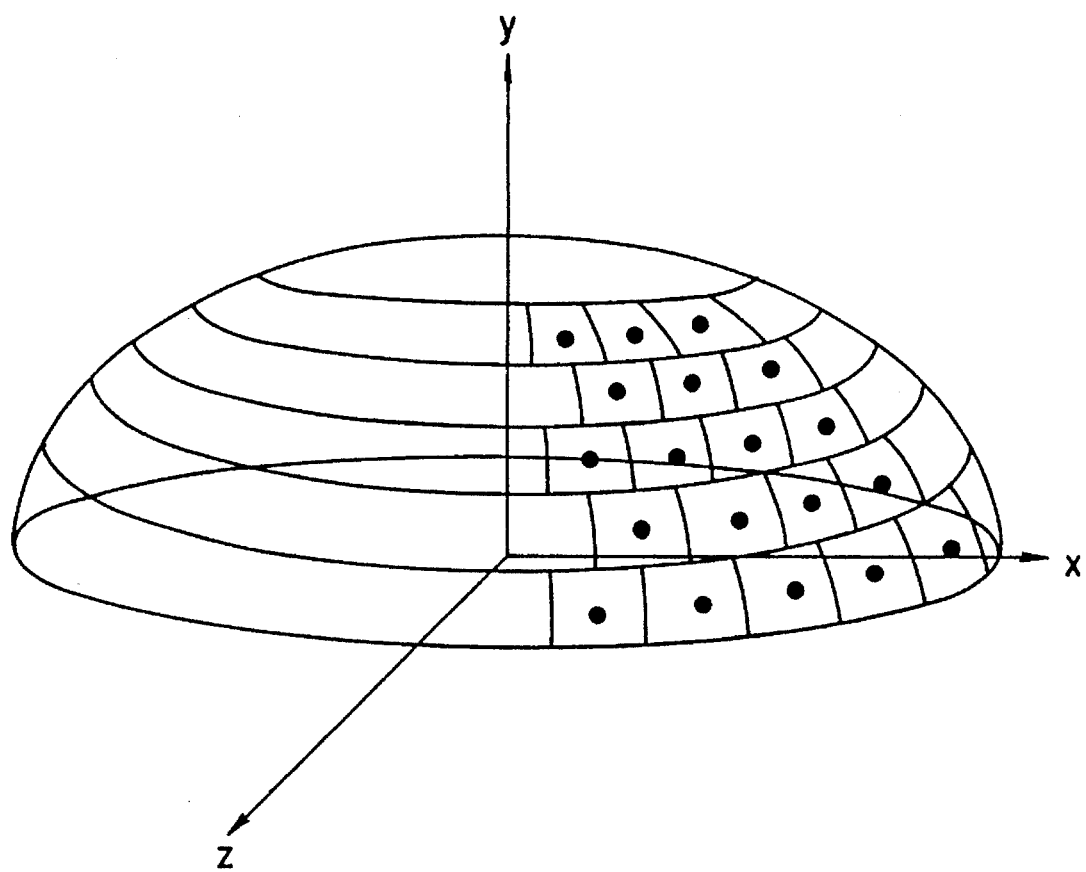
FIG. 3B is a schematically perspective view showing the operation for emitting energy lines in the apparatus according to the first embodiment of the present invention.

FIG. 3B is an image view showing the content of the above-described embodiment of the present invention. As shown in FIG. 3B, energy lines are emitted uniformly.

Unlike the above embodiment in which the energy source is provided on the ceiling in FIG. 1, the emission point of energy lines is provided on the floor surface in order to find the transmission of heat generated by a floor heating apparatus. To this end, energy lines are emitted from the center of the bottom surface a hemisphere to the hemispherical surface as shown in FIG. 3B. The geometrical view factor can be found based on the intensities of energy lines at each surface which the energy line has reached. In addition, the transmission of heat generated by a radiant panel can be found. That is, energy lines are emitted from a given point of the surface of the panel to a hemisphere with the emission point set as the center of the bottom surface the hemisphere. Similarly to the above-described floor heating apparatus, the geometrical view factor can be found.

The above-described means of the present invention may be carried out by software by using a computer, but may be performed by a specialized hardware circuit having each function.

Figure 5:
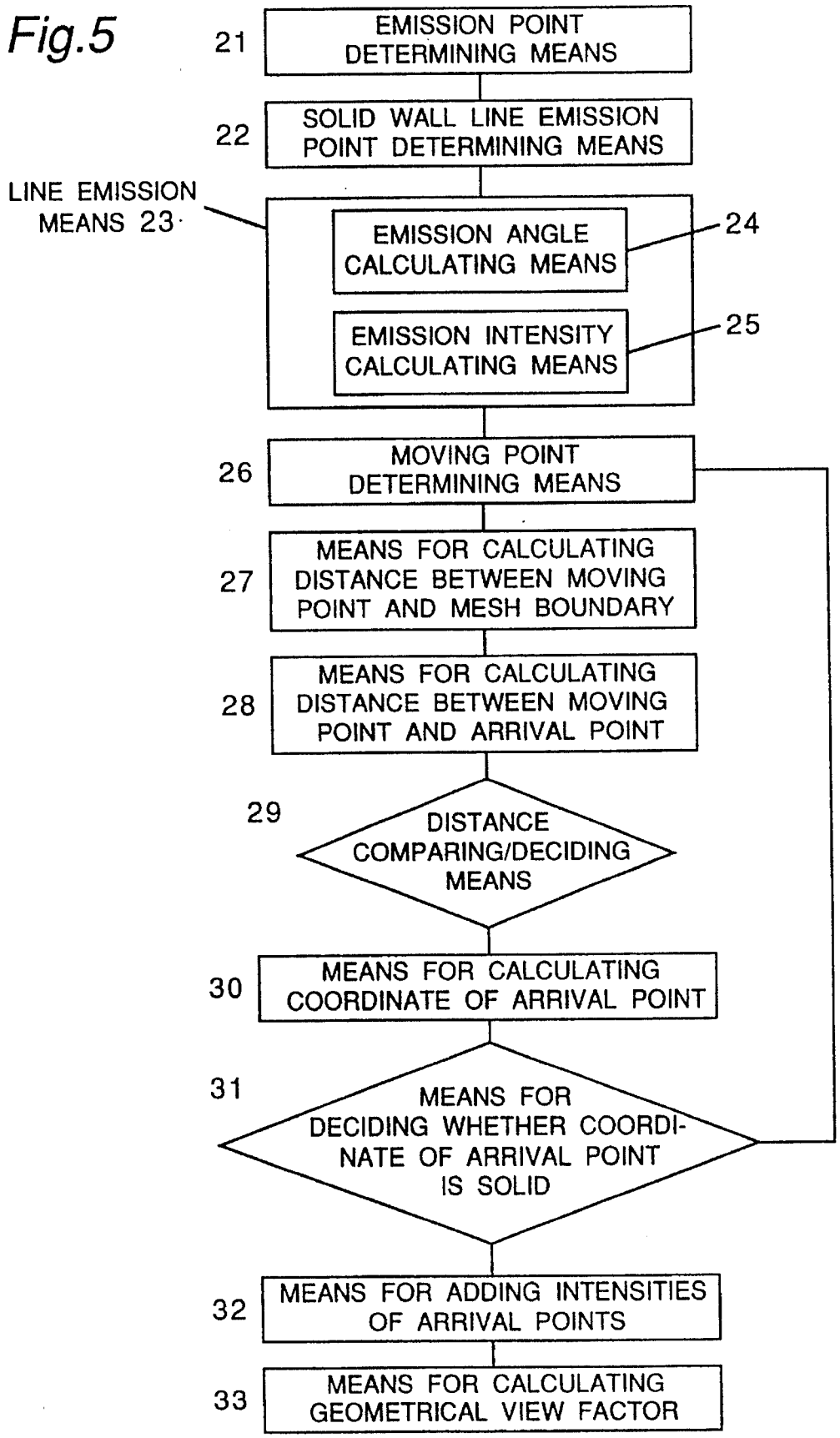
FIG. 5 is a block diagram of part of an apparatus for calculating a geometrical view factor according to the second embodiment of the present invention.
Figure 6:
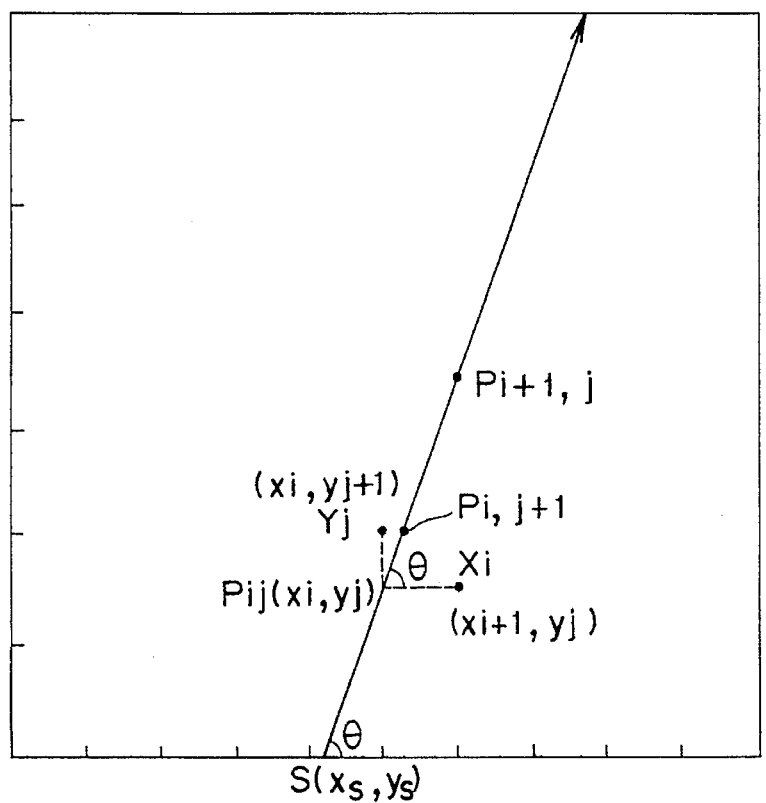
FIG. 6 is an illustration showing energy lines tracing to be carried out by the apparatus in FIG. 5.
Figure 18:
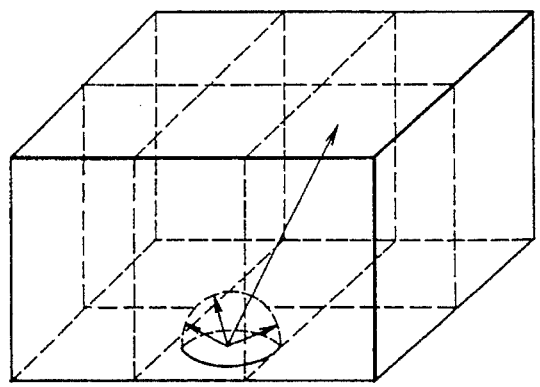
FIG. 18 is an illustration showing energy line tracing to be carried out by a conventional apparatus for calculating a geometrical view factor.
Figure 7:
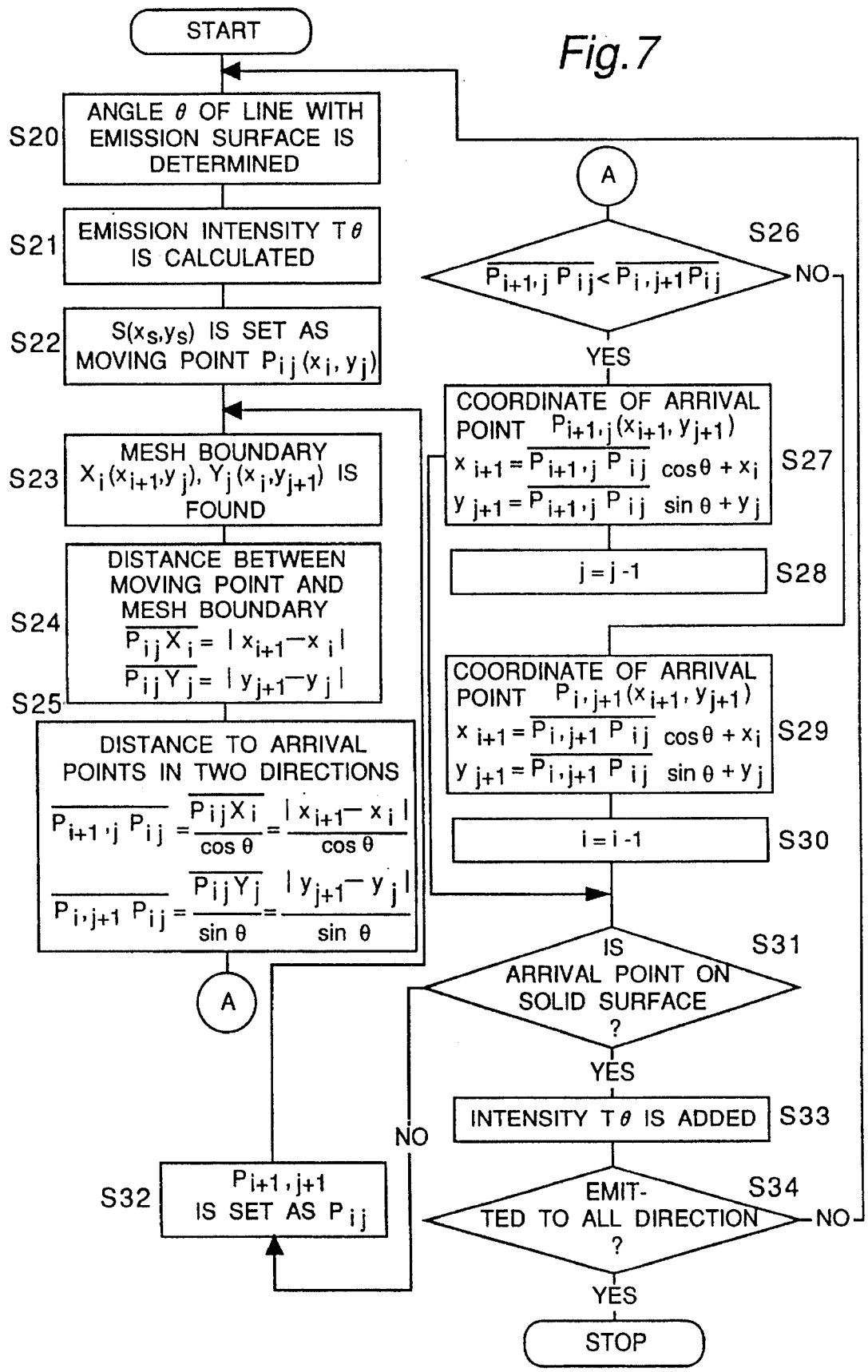
FIG. 7 is a flowchart of the operation, for tracing energy lines, to be performed by the apparatus in FIG. 5.

FIG. 5 is a block diagram showing the construction of an apparatus for tracing energy lines according to the second embodiment of the present invention. FIG. 6 shows the method for tracing energy lines in a two-dimensional mesh element. FIG. 7 is a flowchart of the operation for energy lines to be performed by the apparatus. A surface determining means 21 determines a surface of a solid wall from which energy lines are emitted. A solid-wall-energy line-emission point determining means 22 determines a coordinate S ($X_s$, $Y_s$) of an emission point. The determined coordinate (S) is inputted to an energy line emitting means 23. The energy line emitting means 23 emits energy lines from the emission point. A hemisphere is selected in the case of a three-dimensional mesh. The emission point is located at the center of the bottom surface of the hemisphere. An energy line emission angle calculating means 24 determines the zenithal angle and the horizontal angle of each energy line emitted isotropically from the emission point to the hemispherical surface similar to the first embodiment.

In the case of a two-dimensional mesh in FIG. 6, an emission angle θ formed by each energy line with an emission surface is determined so that energy lines are uniformly emitted (step S20). An emission intensity (Tθ) corresponding to the emission angle θ (a zenithal angle in the case of the three-dimensional mesh) is calculated by an emission intensity calculating means 25 (step S21).

According to the method for tracing energy lines, first, a moving point determining means 26 determines the emission point (S) as a moving point P. ($x_1$, $y_j$) at step S22. Mesh boundaries $x_1$ ($x_{i+1}$, $y_j$), $Y_j$ ($x_1$, $Y_{j+1}$) are found at step S23 in x-direction and y-direction, respectively to find the arrival point of each energy line on the subsequent mesh element. Means 27 for calculating the distance between a moving point and a mesh boundary finds the distance $P_{ij}X_i$, $P_{ij}Y_j$ between the mesh boundary $X_i$ and $Y_i$ and the moving point $P_{ij}$ at step S24. Means 28 for calculating the distance between the moving point and the arrival point finds the distance in x-direction and y-direction between the moving point $P_{ij}$ and the arrival point by dividing the distances $P_{ij}X_i$, $P_{ij}Y_j$ by cosθ and sinθ, respectively at step S25. Distance comparing/deciding means 29 compares the distances with each other, thus selecting the shorter one at step S26. Means 30 for calculating the coordinate of an arrival point finds the coordinate ($x_{i+1}$, $Y_{j+1}$) of the arrival point at step S27 or S29. Then, the coordinate of the moving point is changed at step S28 or S30. If arrival surface deciding means 31 decides that the arrival point is on a solid wall at step S31, arrival intensity adding means 32 adds the intensities $T_\theta$ of the energy lines which have reached the solid wall to each other at step S33. Energy line emitting means 23 emits energy lines by changing an emission angle at step S34. If the arrival point is not on a solid wall at step S31, the arrival point is set as the moving point at step S32 so as to trace energy lines in the subsequent mesh element at steps S23-31. This algorithm is repeated until energy lines are emitted from the surface element of all solid wall surfaces at step S34 to find the geographical view factor between the surface elements by geographical view factor calculating means 33.

In the case of three-dimensional mesh, the emission direction is determined by two parameters and thus the distance comparing operation may be carried out in the three directions.

Figure 8:
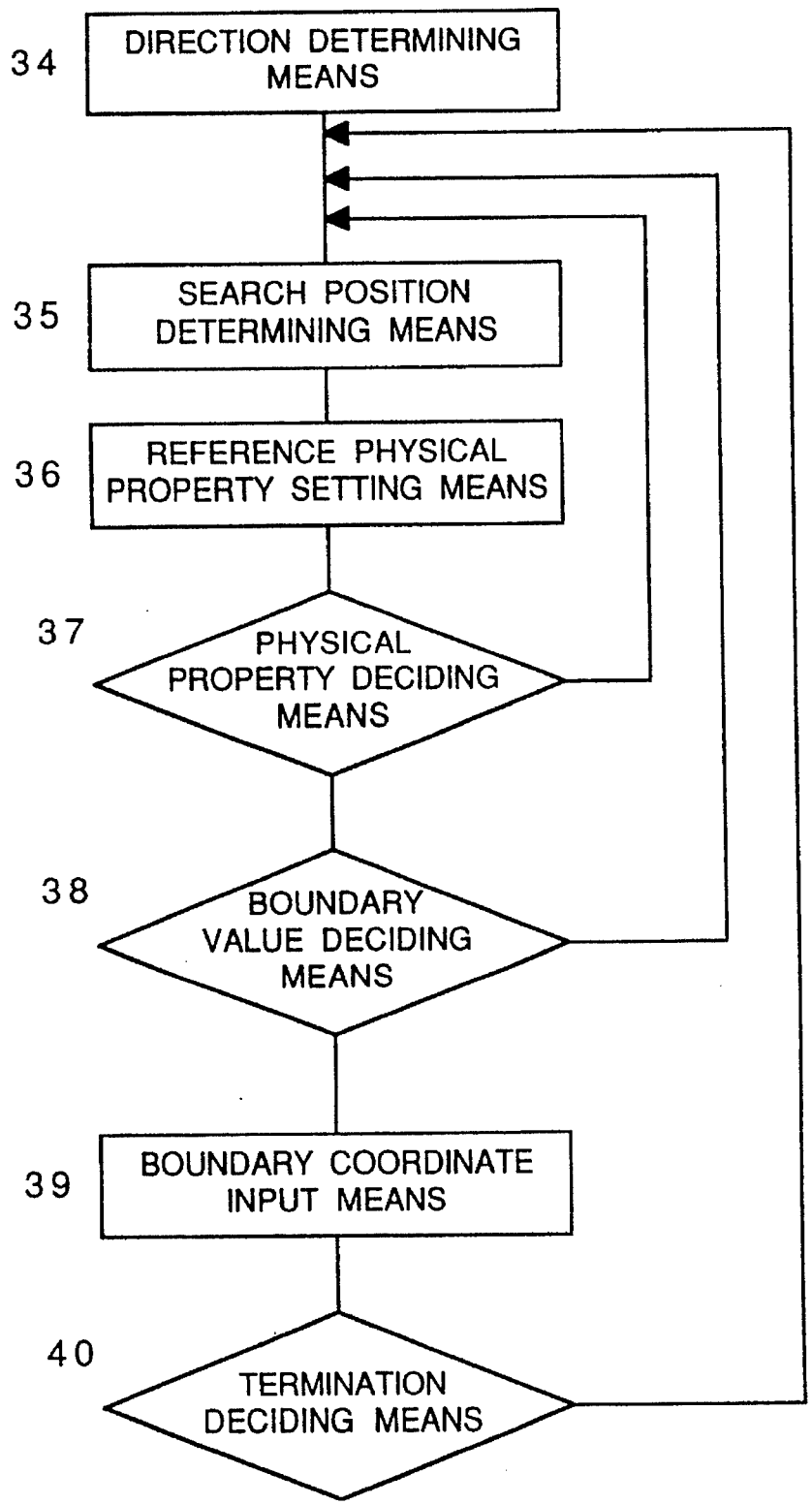
FIG. 8 is a block diagram of a mesh regenerating operation to be carried out by the apparatus in FIG. 5.
Figure 9:
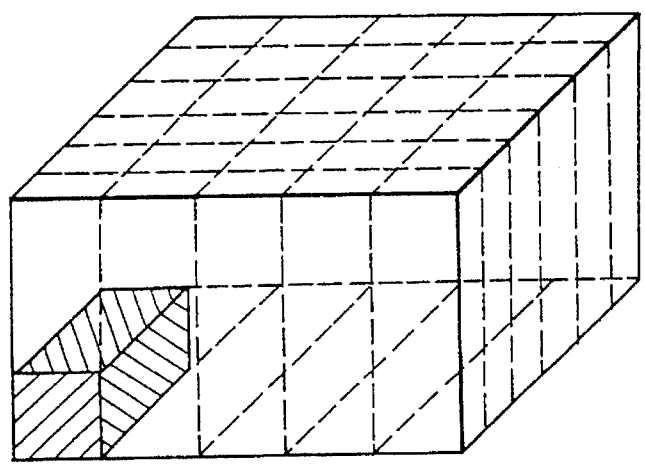
FIG. 9 is an illustration showing a mesh which finely divides a space.
Figure 10:
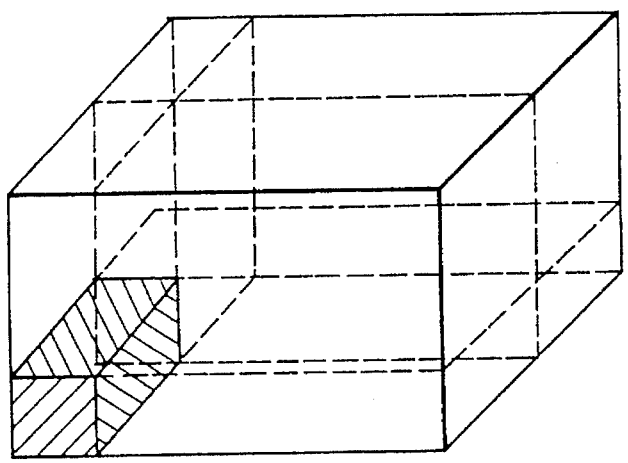
FIG. 10 is an illustration showing a mesh which is finely divided and reconstructed by one mesh element having the same physical property.

In order to quickly trace the energy line from the emission point to the surface which it reaches, a mesh is re-generated by one mesh element having the same physical property to minimize the mesh division of a space. FIG. 8 shows a block diagram of a mesh regenerating operation. When one mesh-divided space as shown in FIG. 9 is made of the same physical property shown by slanting lines in FIG. 10, direction determining means 34 firstly determines which of the three search directions x, y, and z to search the mesh and start to decide whether or not the physical property of the mesh is the same as a reference physical property. Then, search position determining means 35 determines a position from which the search and deciding operation is started in the direction determined by the direction determining means 34. Reference physical property setting means 36 sets the physical property at this position as the reference physical property and then, the subsequent mesh is searched in the determined direction. Then, physical property deciding means 37 decides whether or not the physical property of the mesh to be decided is the same as the reference physical property. If the physical property of the mesh to be decided is the same as the reference physical property, the subsequent mesh is examined in the determined direction and the search and deciding operation is carried out to the mesh. If the physical property of the mesh is not the same as the reference physical property, boundary value deciding means 38 decides whether or not the boundary value has been already inputted. If the boundary value has not been inputted yet, boundary coordinate control means 39 inputs, stores, and outputs the coordinate of the boundary value. Then, according to the output of the control means 39, the reference physical property setting means 36 changes the reference physical property which has been set by the setting means 36 into the physical property of the mesh outputted from the control means 39, and then the reset physical property of the mesh is used as a reference physical property. If the boundary value has been inputted yet, the boundary coordinate input means 19 does not input the coordinate of the boundary value and the subsequent mesh is examined in the determined direction. Thereafter, termination deciding means 40 decides whether or not the physical properties of all meshes in the determined direction have been decided. This operation is performed in each of the three directions x, y, and z so as to input the coordinate of a required boundary value.

Figure 11:
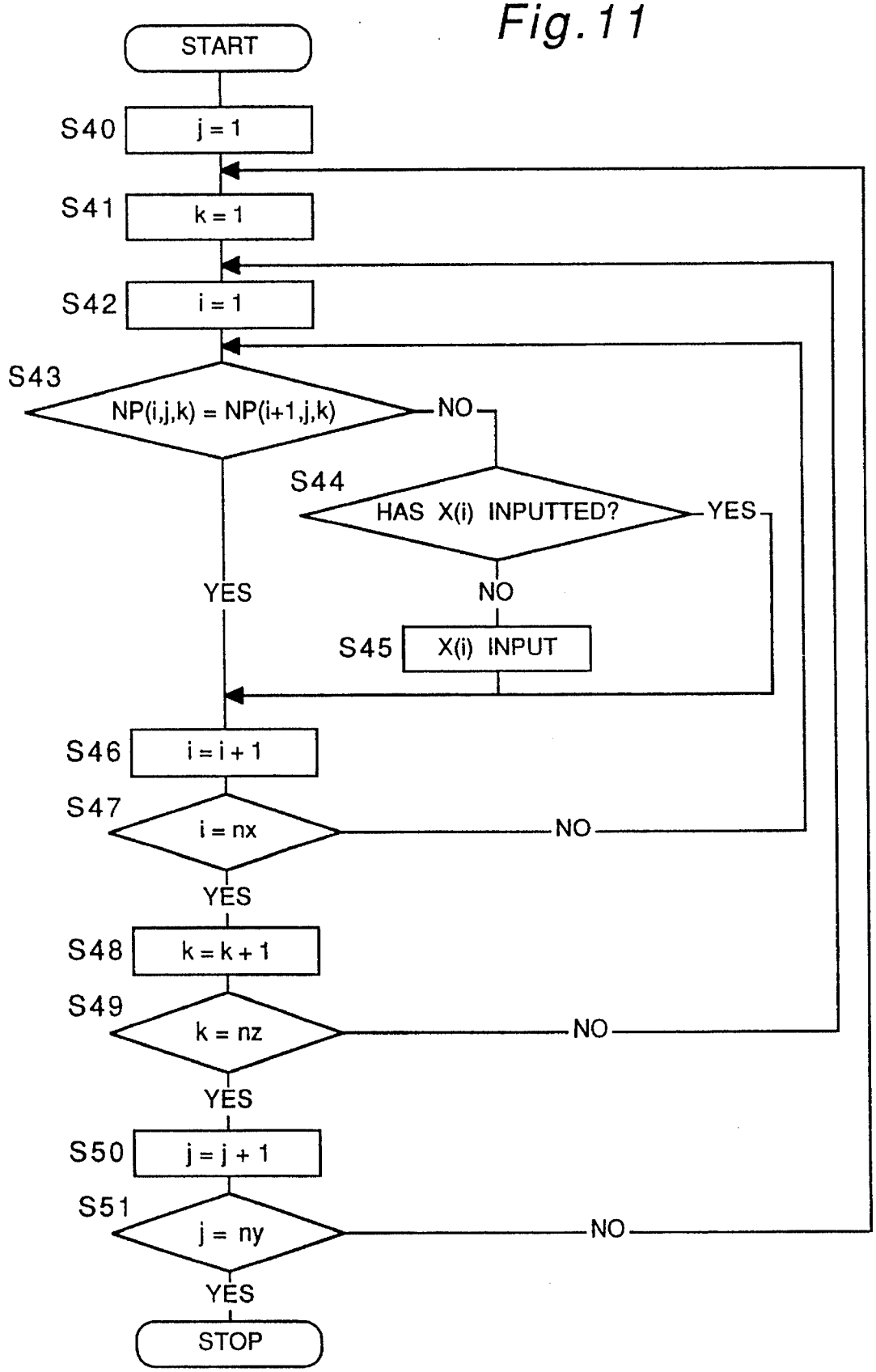
FIG. 11 is a flowchart of an operation for finding a boundary position in re-generating a mesh in x-direction.
Figure 12:
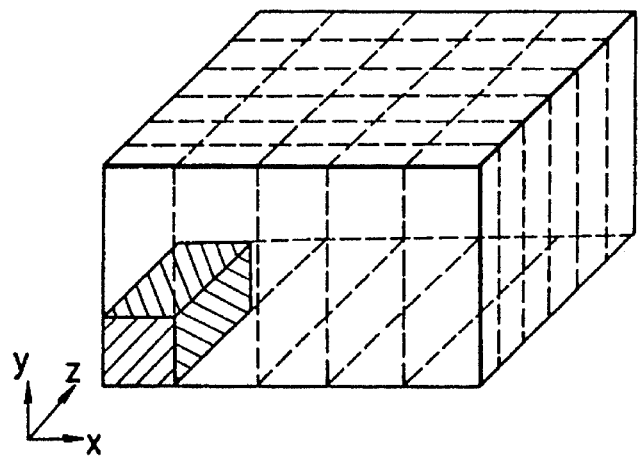
FIG. 12 is an illustration showing a mesh reconstructed by the construction shown in FIG. 11.

FIG. 11 is a flowchart of an operation for finding a boundary position in re-generating a mesh in x direction. As shown in FIG. 12, the number of a boundary coordinate in x-direction and a mesh number are given. That is, (i), (j), and (k) are supposed to be mesh numbers in the x-direction, y-direction, and z-direction, X(i) is supposed to be a mesh coordinate value in the x-direction, and (nx), (ny), (nz) are supposed to be mesh numbers in the three direction before a mesh regeneration. A number to distinguish physical property of a mesh (i, j, k) from the other is supposed to be NP (i, j, k). First, meshes in y-direction and z-direction are fixed at steps S40 and S41 and (x) is changed from (i=1) to (i=nx−1) at steps S42-47. At this time, physical property NP (i, j, k) and NP (i+1, j, k) are compared with each other at step S43. As shown in FIG. 12, for example, if a physical property NP (2, 2, 2) is different from a physical property NP (3, 2, 2), X (2) is inputted at steps S44 and S45. Since physical properties NP (3, 2, 2), NP (4, 2, 2), and NP (5, 2, 2) are the same, X (3) and X (4) are not inputted at step S44. This operation is performed by moving the meshes one by one in y-direction and Z-direction by (ny−1) and (nz−1), respectively at steps S48-51. A physical property NP (2, 2, 3) is not the same as a physical property NP (3, 2, 3), but a coordinate input is not performed because X (2) has been already inputted at steps S43 and S44.

The mesh boundary value in x-direction is found thus and then, re-generated mesh boundary values in y-direction and z-direction are found.

In order to analyze hot air flow, for example, the flow of radiant heat, the apparatus according to the present invention is capable of calculating a geographical view factor between the wall surfaces which form the closed space. In addition, the apparatus calculates the geographical view factor quickly and accurately.

Figure 15:
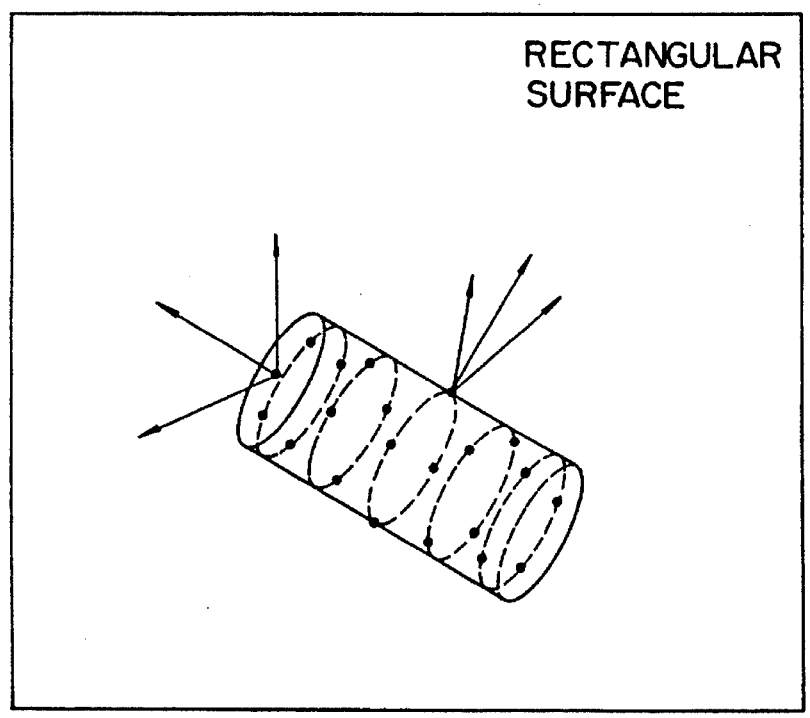
FIG. 15 is a view showing emission points arranged on the surface of a cylinder for an apparatus for calculating a geographical view factor according to the modification of the third embodiment of the present invention.
Figure 13:
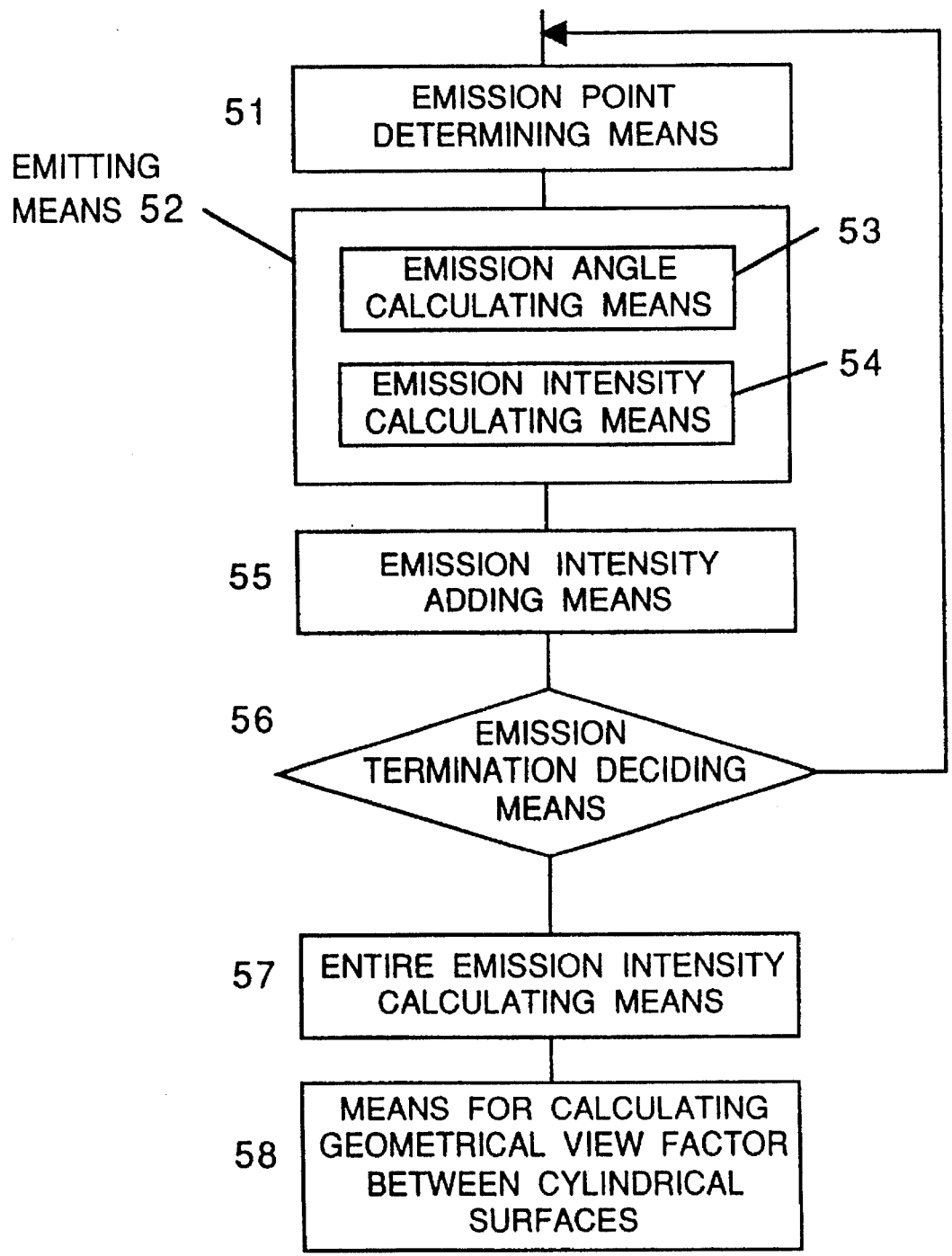
FIG. 13 is a block diagram showing an apparatus for calculating a geographical view factor according to the third embodiment of the present invention.

FIG. 13 is a block diagram showing the construction of an apparatus in accordance with the third embodiment of the present invention. First, energy line emission point determining means 51 determines the energy line emission points on a cylindrical surface set in a closed space as shown in FIG. 15. An energy line emitting means 52 emits energy lines. Energy lines are emitted from the center of the bottom surface, serving an emission surface, of a hemisphere to the surface thereof. The emission surface is a tangent plane of the cylindrical surface. Emission angle calculating means 53 of the energy line emitting means 52 calculates a horizontal angle and a zenithal angle of the energy line in the hemisphere.

Emission intensity calculating means 54 calculates the emission intensity of each energy line corresponding to the zenithal angle, thus emitting energy lines to the hemispherical surface isotropically like the first embodiment. After the emitted energy lines arrive at the surface forming the closed space, arrival intensity adding means 55 adds to each other the intensities of the arrived energy lines on each surface. This operation is carried out until a predetermined number of energy lines are emitted from the emission point. Then, emission termination deciding means 56 decides whether or not energy lines have been emitted from all the emission points of the cylindrical surface. If no, the energy line emission point determining means 51, the energy line emitting means 52, the arrival intensity adding means 55, and the emission termination deciding means 56 perform the above operations again. After energy lines are emitted from all the emission points, entire emission intensity calculating means 57 calculates the entire intensity of energy lines emitted from all the emission points on the cylindrical surface. Then, geographical view factor calculating means 58 calculates the ratio of the arrival intensity of each surface found by the emission intensity adding means 55 to the entire intensity. Thus, the geographical view factor between the cylindrical surface and the surface forming the closed space.

Figure 14:
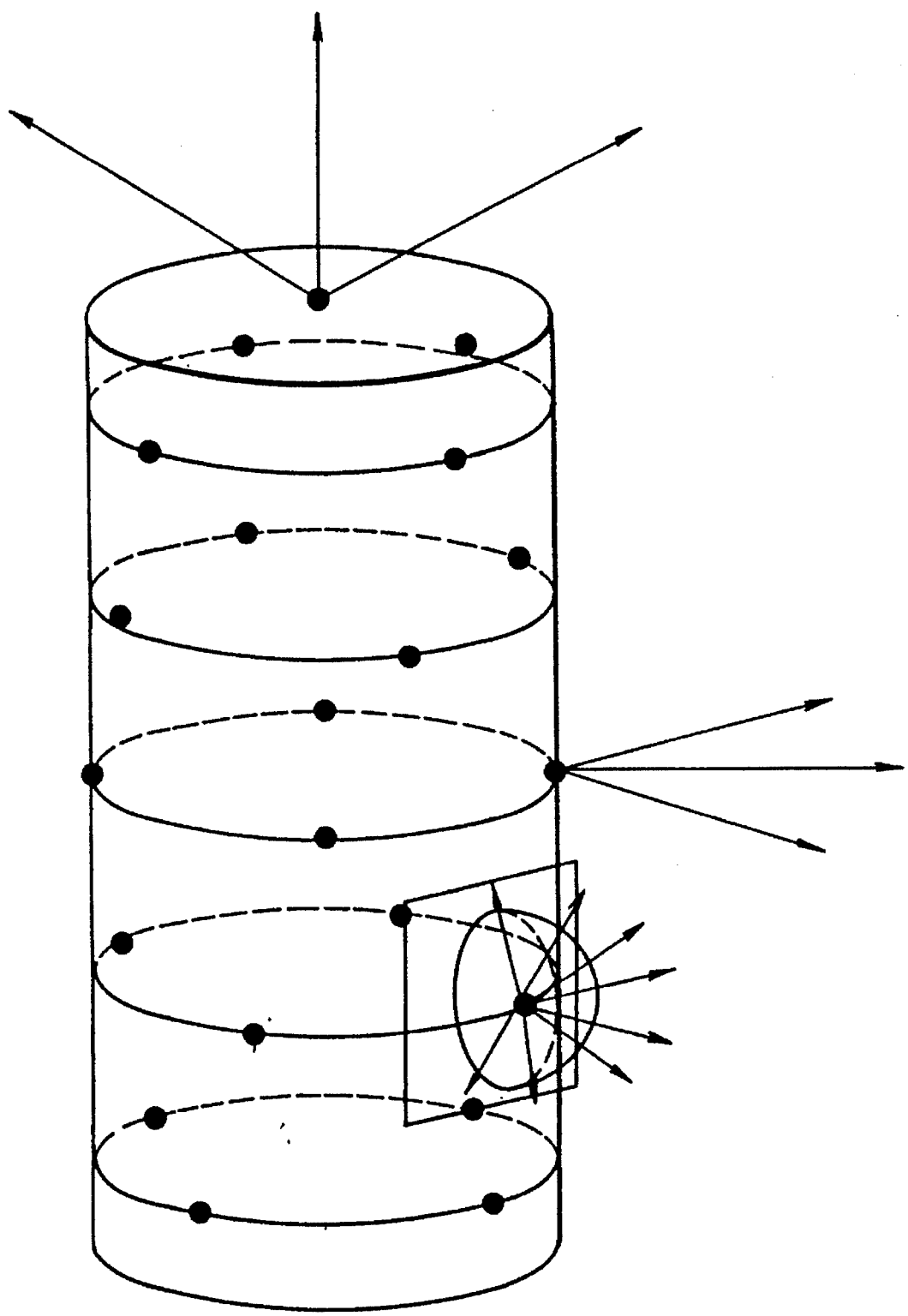
FIG. 14 is a view showing emission points arranged on the surface of a cylinder for the apparatus in FIG. 13.
Figure 16:
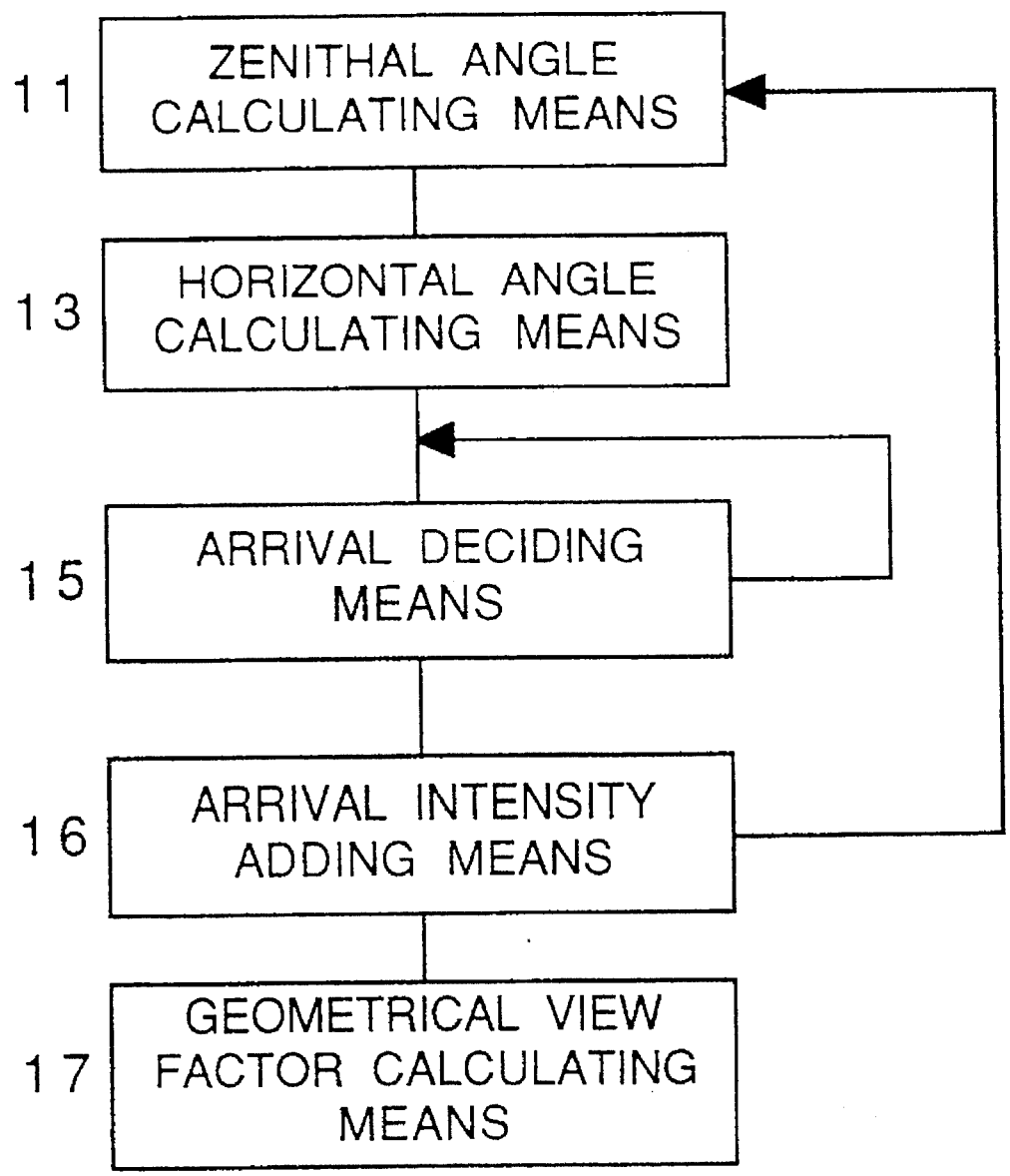
FIG. 16 is a block diagram showing the construction of a conventional apparatus for calculating a geometrical view factor.
Figure 17:
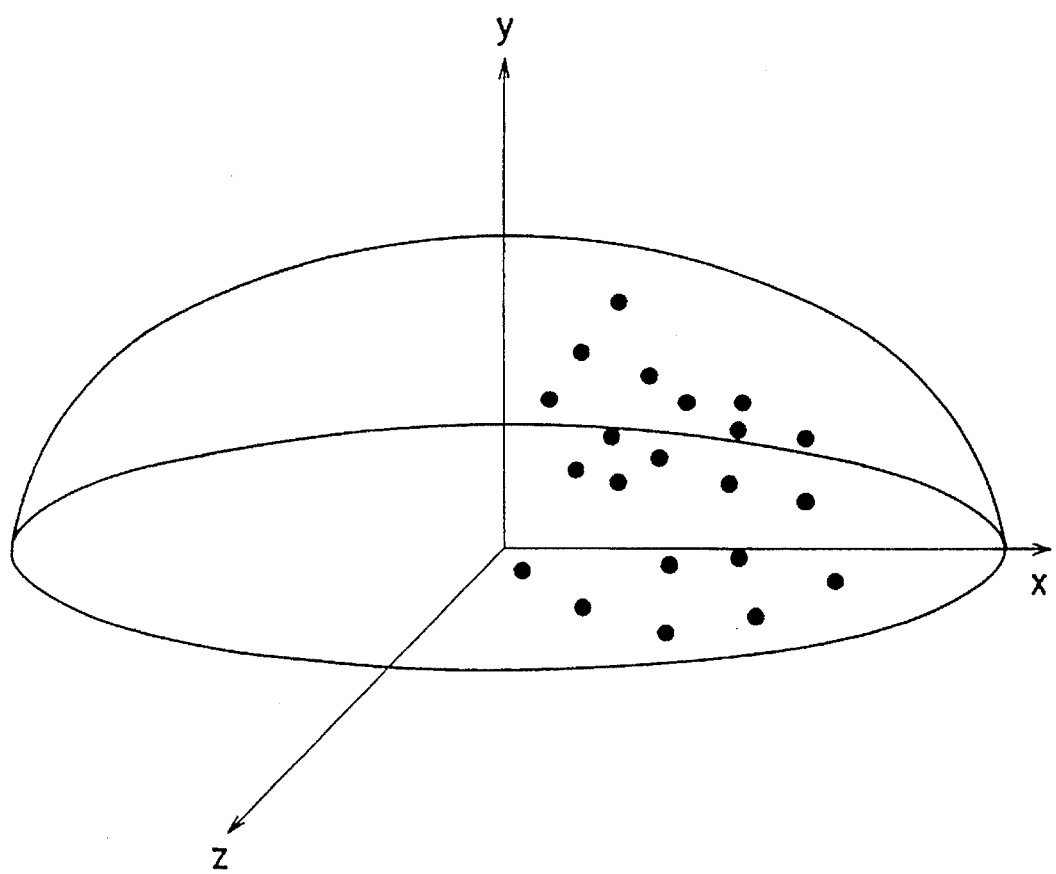
FIG. 17 is a schematically perspective view showing the content of the conventional apparatus for calculating a geometrical view factor.
Figure 19:
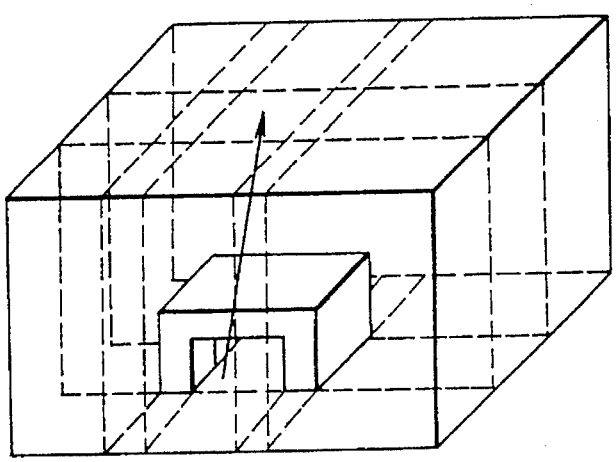
FIG. 19 is an illustration showing an energy line tracing to be carried out by the conventional apparatus when there is a furniture in a space.

FIG. 14 shows an example of emission points provided on a cylindrical surface. The emission points of the bottom surface are positioned at the center thereof. The emission points of the cylindrical surface are spaced at regular intervals in the axial and circumferential directions thereof. The geometrical view factor between the and the surface forming the closed space is found by the ratio of the intensity of each surface obtained by an addition to the entire intensity.

FIG. 15 shows the modification of the third embodiment of the present invention. In this modification, a geographical view factor is calculated supposing that a cylinder is inclined to an object rectangular surface. When a human is sitting on a chair with his back against the back of the chair, his body is inclined to the floor surface and his legs are not perpendicular to the floor surface. Therefore, such an inclination of the cylinder imitated from the human allows a geographical view factor calculation close to reality. When the cylinder is inclined, a tangent plane serving as the emission surface is set on the emission point of the cylindrical surface of the cylinder and energy lines are emitted from the emission point to the hemispherical surface formed on the tangent plane. If the tangent plane is set on an emission point of even any arbitrary curved surface imitated from a human body, energy lines are emitted from the emission point to the hemispherical surface on the tangent plane to calculate a geographical view factor.

Figure 20:
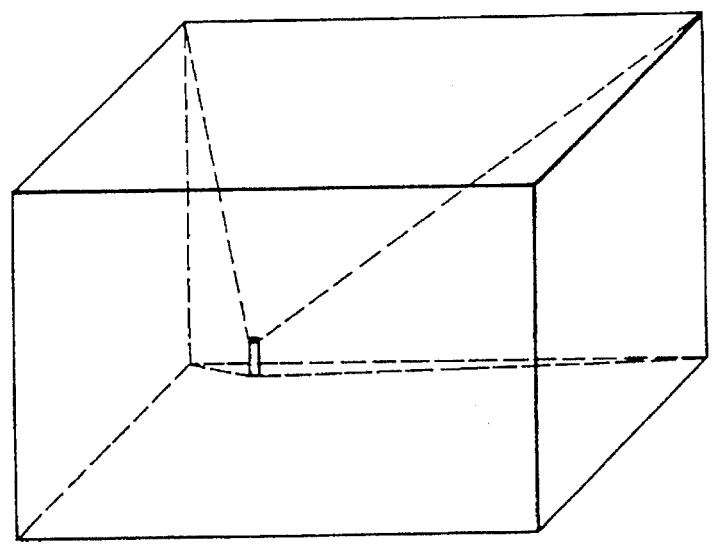
FIG. 20 is a model view in which a human body is supposed as a microcylinder in a conventional apparatus for calculating a geographical view factor.
Figure 21:
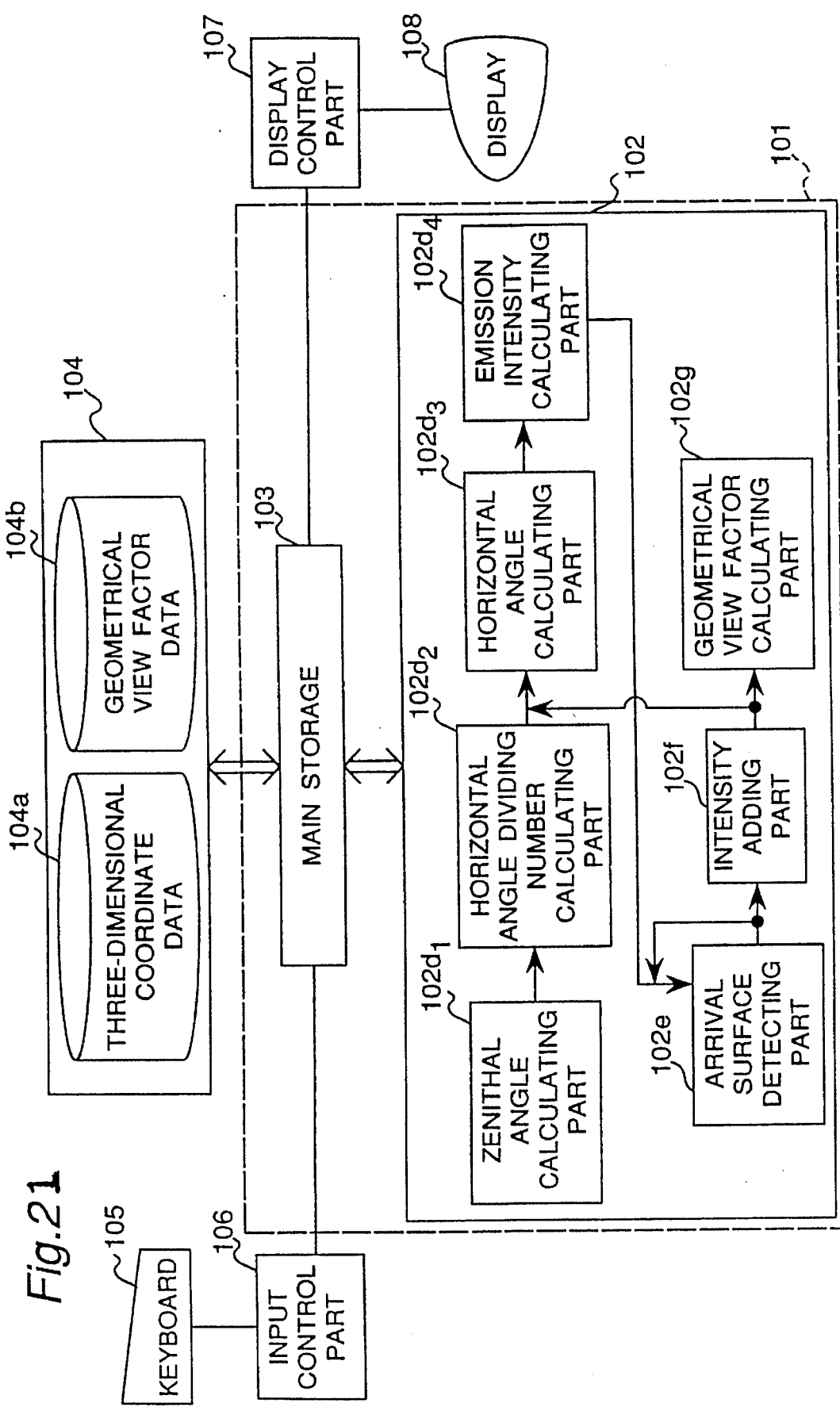
FIG. 21 is a block diagram showing an apparatus for calculating a geometrical view factor between a spherical surface and a solid surface in a case where the apparatus shown in FIG. 2 includes a keyboard and a display etc.

FIG. 21 shows an apparatus for calculating a geometrical view factor between a spherical surface and a solid surface in a case where the apparatus shown in FIG. 2 includes a keyboard as an input device and a display etc. That is, the apparatus includes: a CPU 101 having a processing part 102 and a main storage 103; a storage device 104 for storing data; a keyboard 105 for inputting a three-dimensional coordinate and a position of a surface of an object; an input control part 106; a display control part 107; and a display 108. The inputted three-dimensional coordinate and position of the object surface are stored in three-dimensional coordinate data 104a of the storage device 104 as a three-dimensional coordinate data through the input control part 106. Based on the data, the geometrical view factor is calculated through the following parts in the processing part 102. The processing part 102 includes a zenithal angle calculating part $102d_1$ corresponding to the zenithal angle calculating means 1 in FIG. 2, a horizontal angle dividing number calculating part $102d_2$ corresponding to the means 2 for calculating dividing number of horizontal angles, a horizontal angle calculating part $102d_3$ corresponding to the horizontal angle calculating means 3, an emission intensity calculating part $102d_4$ corresponding to the emission intensity calculating means 4, an arrival surface detecting part 102e corresponding to the arrival deciding means 6, an intensity adding part 102f corresponding to the arrival intensity adding means 7, and a geometrical view factor calculating part 102g corresponding to the means 8 for calculating geometrical view factor. The apparatus in FIG. 20 does not include the indoor configuration coordinate input means 5 in FIG. 2, but instead of the means 5, the data which should be inputted by the means 5 is read from the three-dimensional coordinate data 104a. The zenithal angle calculating parts $102d_1$ divides the spherical surface at regular intervals in a zenithal angle direction to determine a zenithal angle. The horizontal angle dividing number calculating part $102d_2$ calculates a horizontal angle dividing number in correspondence with the zenithal angle. The horizontal angle calculating part $102d_3$ divides an entire horizontal angle based on the horizontal angle dividing number to determine a divided horizontal angle. The emission intensity calculating part $102d_4$ determines an intensity in correspondence with the horizontal angle. The arrival surface detecting part 102e detects whether or not a heat energy line having the above intensity and emitted from the center of the spherical surface to a point thereof determined by the determined zenithal angle and horizontal angle reaches the object surface. When the energy line does not reach the object surface, i.e. reaches air, the detecting processing is repeated by the arrival surface detecting part 102e. The intensity adding part 102f adds to each other the intensities of the reached heat energy for each solid surface where the energy lines have been reached. Until all energy lines are emitted, the above processes are repeated by the horizontal angle calculating part $102d_3$, the emission intensity calculating part $102d_4$, the arrival surface detecting part 102e, and the intensity adding part 102f. The geometrical view factor calculating part 102g finds a ratio of the emitted entire energy and the reached intensity after all energy lines are emitted from a heat source, and then sets the ratio as geometrical view factor. The calculated geometrical view factor is stored as geometrical view factor data 104b of the storage device 104, and then the detected result is displayed by the display 108 through the display control part 107.

Figure 22:
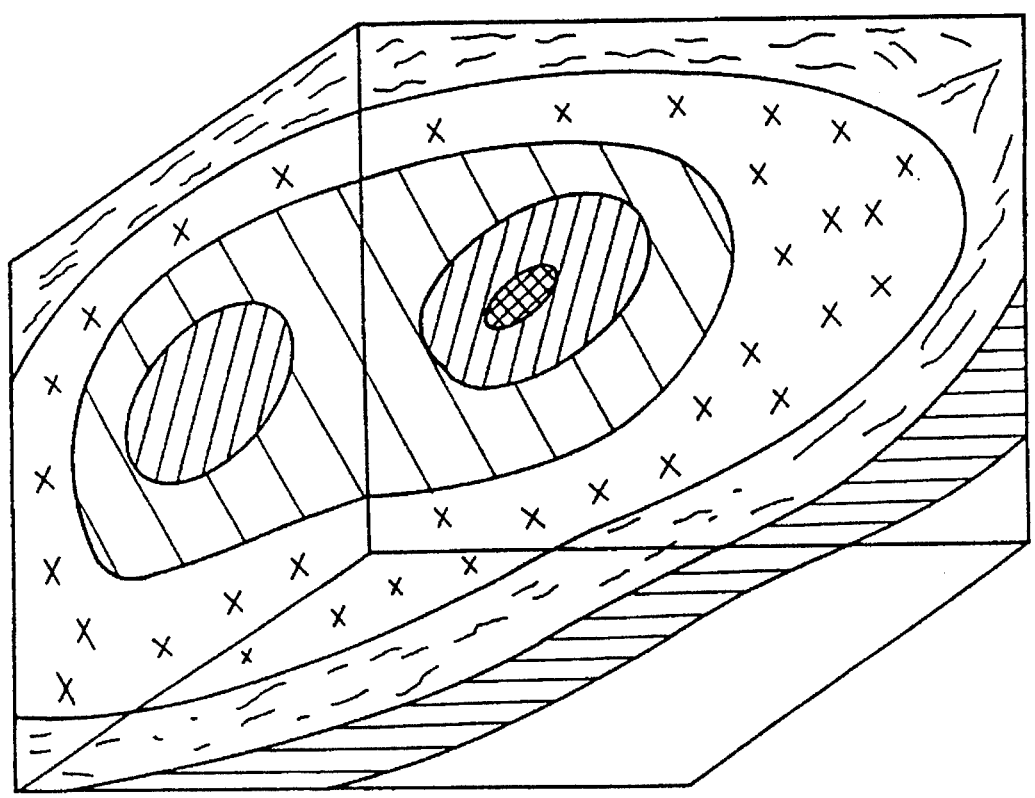
FIG. 22 is a diagram showing an example of a distribution on a solid wall of a geometrical view factor displayed on the display 8.

FIG. 22 shoes an example of a distribution on a solid wall of a geometrical view factor displayed on the display 108.

Figure 23:
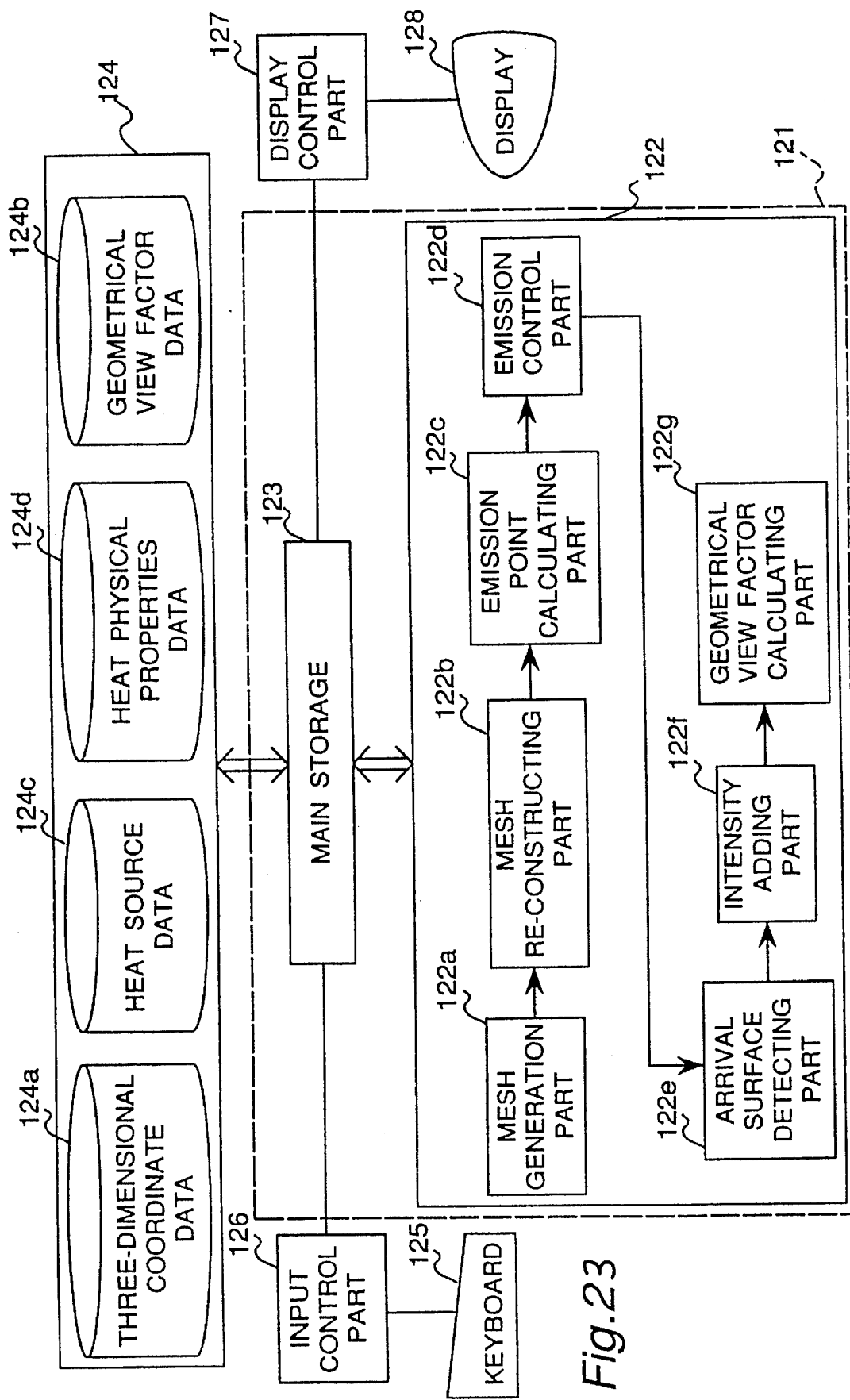
FIG. 23 is a block diagram showing an apparatus for calculating a geometrical view factor between solid surfaces according to a fourth embodiment of the present invention.
Figure 24:
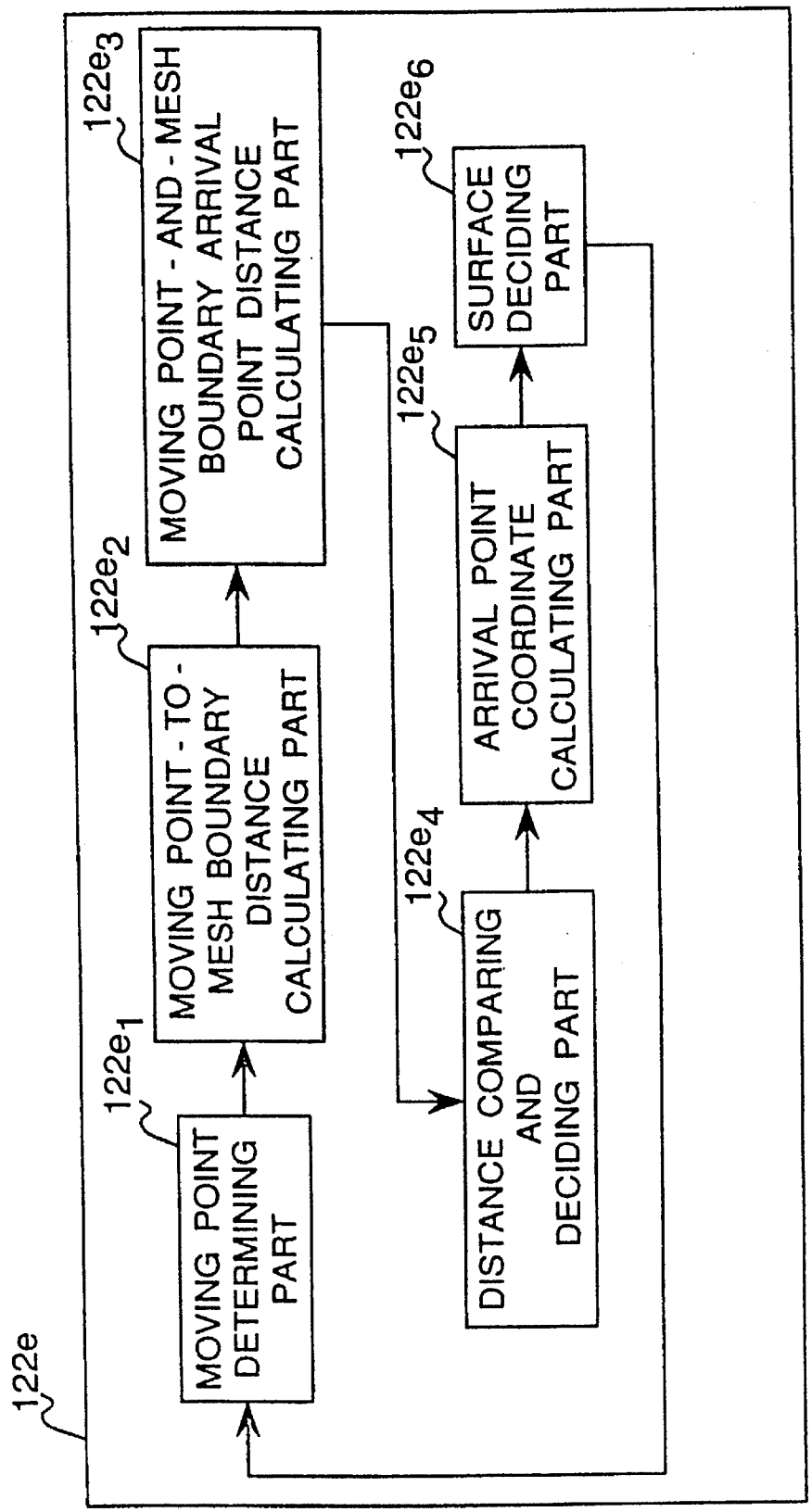
FIG. 24 is a block diagram showing an arrival surface detecting part in FIG. 23.

FIG. 23 shoes an apparatus for calculating a geometrical view factor between solid surfaces according to a fourth embodiment of the present invention. The apparatus includes: a CPU 121 having a processing part 122 and a main storage 123; a storage device 124; a keyboard 125; an input control part 126; a display control part 127; and a display 128. The storage device 124 stores three-dimensional coordinate data 124a, geometrical view factor data 124b, heat source data 124c defining a position of the heat source, and heat physical properties data 124d including values of heat physical properties. The processing part 122 includes a mesh generation part 122a for generating a mesh, a mesh reconstructing part 122b, an emission point calculating part 122c, an emission control part 122d including the zenithal angle calculating part $102d_1$ through the emission intensity calculating part $102d_4$ in FIG. 20, an arrival surface detecting part 122e, an intensity adding part 122f, and a geometrical view factor calculating part 122g. A coordinate of a point for emitting energy from the heat source based on the heat source data is determined by the emission point calculating part 122c. Then, a heat energy line for each emission point is uniformly emitted on a hemispherical surface. In order to perform these operations, based on the emission angle determined by the emission control part 122d for calculating the angle and intensity by the zenithal angle calculating part $102d_1$ through the emission intensity calculating part $102d_4$ in FIG. 10, the arrival surface detecting part 122e is shown in FIG. 24 for detecting a solid arrived from the emission point. The block diagram in FIG. 24 corresponds to that in FIG. 5. The arrival surface detecting part 122e includes a moving point determining part $122e_1$ corresponding to the moving point determining means 26 in FIG. 5, a moving point-to-mesh boundary distance calculating part $122e_2$ corresponding to the means 27 for calculating the distance between a moving point and a mesh boundary, a moving point-to-mesh boundary arrival point distance calculating part $122e_3$ corresponding to the means 28 for calculating the distance between the moving point and the arrival point, a distance comparing and deciding part $122e_4$ corresponding to the distance comparing/deciding means 29, an arrival point coordinate calculating part $122e_5$ corresponding to the means 30 for calculating the coordinate of an arrival point, and a surface deciding part $122e_6$ corresponding to the arrival surface deciding means 31.

The moving point determining part $122e_1$ determines the emission point as a moving point. The moving point-to-mesh boundary distance calculating part $122e_2$ finds distances between the moving point in three-dimension and subsequent mesh boundaries in three-dimensional directions. The moving point-to-mesh boundary arrival point distance calculating part $122e_3$ calculates a distance between the moving point and an arrival point where an energy line from the moving point and an arrival point where an energy line from the moving point is arrived to each mesh boundary determined in each of the three directions determined by the calculated zenithal and horizontal angles stored in the main storage 123. The distance comparing and deciding part $122e_4$ compares distances in the three directions calculated by the moving point-to-mesh boundary arrival point distance calculating part $122e_3$ with each other and then selects the minimum distance from the compared distances. The arrival point coordinate calculating part $122e_5$ calculates a coordinate of the arrival point relating to the minimum distance. The surface deciding part $122e_6$ decides whether or not the mesh coordinate calculated by the arrival point coordiante calculation gpart $122e_5$ is included in the solid surface based on the physical properties for each mesh stored in the main storage 123. When the surface deciding part $122e_6$ decides that the mesh coordinate is not included in the solid wall, the arrival point is set as a moving point by the moving point determining part $122e_1$. Then, until the surface deciding part $1222e_6$ decides that the mesh coordinate is included in the solid wall, the above operation is repeated to detect the solid surface to be arrived.

The intensity adding part 122f adds to each other intensities of arrival heat energy for each of the solid surfaces where energy lines are arrived. The geometrical view factor calculating part 122g finds a ratio between emitted entire energy and arrival intensity after all energy llines are emitted from the heat source, and then sets the ratio as a geometrical factor. The calculated ratio is stored as the geometrical view factor data 124b, and then the result is displayed on the display 128 through the display control part 127.

Figure 25:
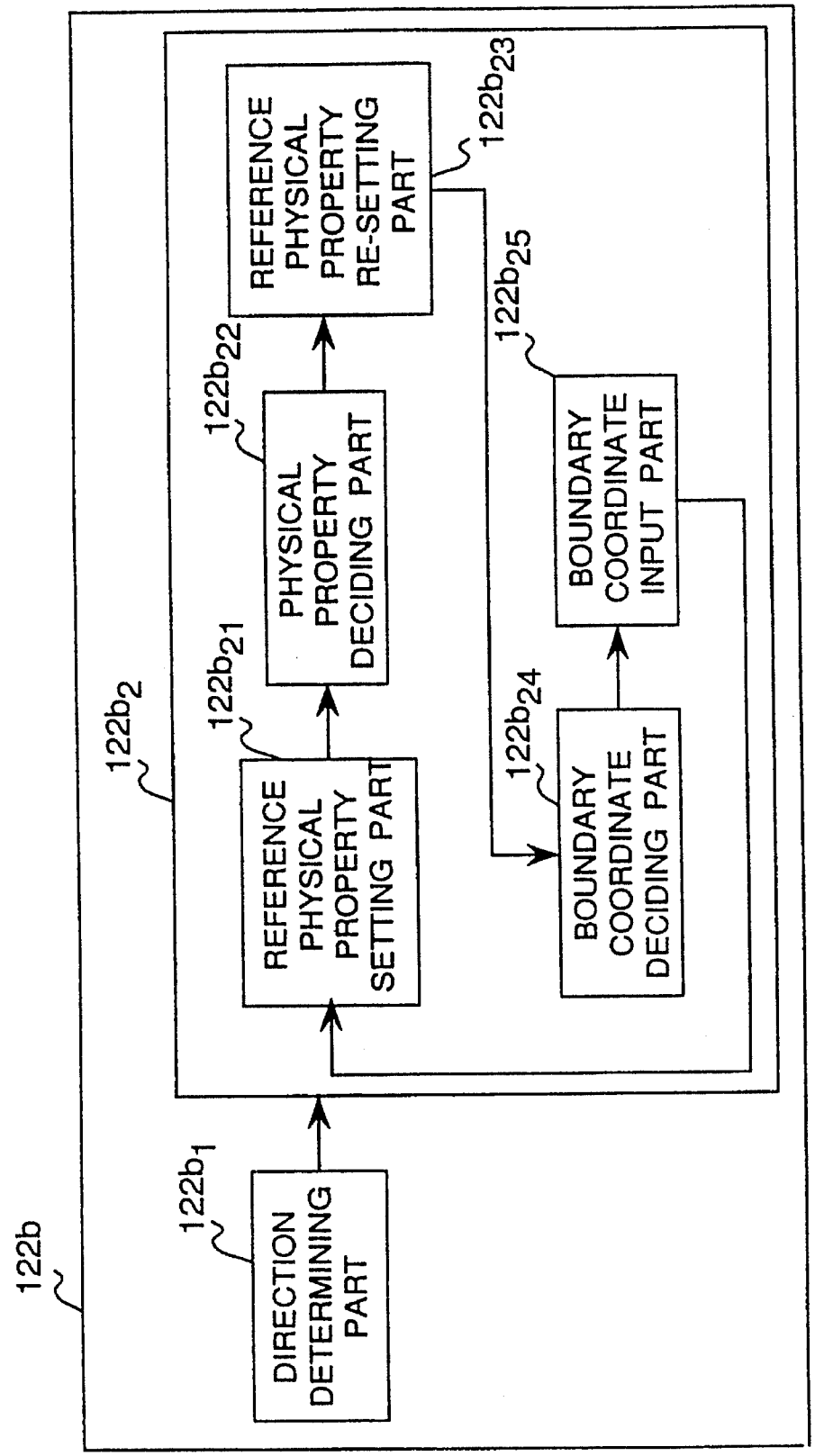
FIG. 25 is a block diagram showing a mesh reconstructing part in FIG. 23.

FIG. 25 shows a view explaining the mesh re-constructing part 122b in FIG. 22 and corresponds to FIG. 8. The mesh re-constructing part 122b includes a direction determining part $122b_1$ corresponding to the direction determining means 34 in FIG. 8 and a one direction mesh re-constructing part $122b_2$ corresponding to the search position determining means 35. The one direction mesh re-constructing part $122b_2$ has a reference physical properties setting part $122b_{21}$ corresponding to the reference physical property setting means 36, a physical property deciding part $122b_{22}$ corresponding to the physical property deciding means 37, a reference physical property re-setting part $122b_{23}$, a boundary coordinate deciding part $122b_{24}$ corresponding to the boundary value deciding means 38, and a boundary coordinate input part $122b_{25}$ corresponding to the boundary coordinate control means 39.

The direction determining part $122b_1$ determines a direction for re-constructing (re-generating). The reference physical property setting part $122b_{21}$ sets as a reference the physical property of a first mesh in the direction to be detected for re-constructing. The physical property deciding part $122b_{22}$ decides whether or not the physical property of a subsequent mesh at a position of the subsequent mesh in the detecting direction is the same as the reference physical property set by the reference physical property setting part $122b_{21}$. When the physical property deciding part $122b_{22}$ decides that the physical property of the subsequent mesh is not the same as the reference physical property, the physical property of the subsequent mesh at the position is re-set as a reference physical property by the reference physical property re-setting part $122b_{24}$ decides whether or not a coordinate of the boundary is not the same as the coordinate of the re-constructed mesh, the coordinate of the boundary is stored as a coordinate of a re-constructed mesh in the main storage 123 by the boundary coordinate input part $122b_{25}$. The one direction mesh re-constructing part $122b_2$ repeats the operations by the reference physical property setting part $122b_{21}$ through the boundary coordinate input part $122b_{25}$, and moves a to-be-detected position in the detecting direction so as to perform the detection at all mesh positions and store the boundary coordinates and the physical properties in the main storage 123. The above detecting and re-constructing operations are performed in each of the three directions.

According to the present invention, the geometrical view factor of a cylinder or a human body and a rectangular surface can be precisely and quickly calculated. Thus, the transmission of radiant heat can be accurately and quickly calculated.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed:

1. An apparatus for analyzing energy distribution in a room using a model of an energy system to be installed in the room, said energy system having an energy source, said room having at least one desired three dimensional object therein and being defined by three dimensional coordinates, said apparatus comprising:

input means for inputting three dimensional coordinates relating to the room to be analyzed including position coordinates of an energy source which causes energy to be transferred, position coordinates of a surface within the room, position coordinates and a value of heat physical property of a solid body existing within the room;

memory for storing the inputted three dimensional coordinates relating to the room, for storing information relating to meshes generated by a mesh generating means, for storing the energy source data, and for storing the position and heat physical property value;

processing means, coupled to the memory, for calculating the geometrical view factor based on the controlled numerical values including:

mesh generating means for generating and defining meshes within the room using three dimensional coordinates;

mesh re-constructing means for re-constructing the three dimensional coordinates of the meshes generated by the mesh generating part, in consideration of physical property for each mesh;

emission point calculating means for determining a coordinate of an emission point for emitting energy from the energy source based on the energy source data;

emission control means for determining zenithal and horizontal angles and intensities of energy lines so as to simulate uniform emission of energy lines on a hemispherical surface for each emission point, said angles being stored in said memory;

arrival surface detecting means for detecting, based on the simulated emission of the energy lines, a solid surface reached by the emitted energy lines from the emission point, said arrival surface detecting means including:

moving point determining means for determining the emission point as a moving point;

moving point-to-mesh boundary distance calculating means for determining distances between the moving point in three-dimension and subsequent mesh boundaries in three-dimensional directions;

moving point-to-mesh boundary arrival point distance calculating means for calculating a distance between the moving point and an arrival point where the energy lines from the moving point arrive at each mesh boundary in each of the three directions determined by the calculated zenithal and horizontal angles stored in the memory;

distance comparing and deciding means for comparing the distances in the three directions calculated by the moving point-to-mesh boundary arrival point distance calculating means with each other and then selecting a minimum distance from the compared distances;

arrival point coordinate calculating means for calculating a coordinate of the arrival point relating to the minimum distance; and surface deciding means for deciding whether or not the mesh coordinate calculated by the arrival point coordinate calculating part is included in the solid surface based on the physical properties for each mesh stored in the memory, such that if the surface deciding means decides that the mesh coordinate calculated by the arrival point coordinate calculating means is not included in the solid surface, the moving point determining determines the arrival point as a moving point so as to repeatedly operate the moving point-to-mesh boundary distance calculating means, the moving point-to-mesh boundary arrival point distance calculating means, the distance comparing and deciding means, the arrival point coordinate calculating means, and the surface deciding means decides that the mesh coordinate calculated by the arrival point coordinate calculating means is included in the solid surface;

intensity adding means for adding to each other the intensity of energy of the energy line for each of the solid surfaces at which the energy line arrived arrives; and geometrical view factor determining means for determining a ratio of the entire emitted energy from the energy source and arrival intensity after simulated emission of all energy lines, and then setting the ratio as a geometrical factor and storing it in memory.

2. The apparatus as claimed in claim 1, wherein the mesh reconstructing means includes:

direction determining means for determining a direction for re-constructing; and one direction mesh re-constructing means, the one direction mesh re-constructing means including:

reference physical property setting means for setting, as a reference physical property, physical property of a first mesh in a direction to be detected for re-constructing;

physical property deciding means for deciding whether or not physical property of a subsequent mesh position in the detecting direction is the same as the reference physical property set by the reference physical property setting means, reference physical property re-setting means for re-setting the physical property of the subsequent mesh at a position of the subsequent mesh as a reference physical property when the physical property deciding means decides that the physical property of the subsequent mesh is not the same as the reference physical property;

boundary coordinate deciding means for deciding whether or not a coordinate of the boundary is the same as a coordinate of the re-constructed mesh previously stored in the memory; and boundary coordinate input means for storing the coordinate of the boundary as a coordinate of a re-constructed mesh in the memory when the boundary coordinate deciding means decides that the coordinate of the boundary is not the same as the coordinate of the re-constructed mesh, wherein the one direction mesh re-constructing means repeats the operations performed by the reference physical property setting means, the physical property deciding means, the reference physical property re-setting means, the boundary coordinate deciding means, and the boundary coordinate input means, and moves to a to-be-detected position in the detecting direction so as to perform the detection at all mesh positions and store boundary coordinates and physical properties in the memory, the detecting and re-constructing operations are performed in each of the three directions.

3. An apparatus for analyzing energy distribution in a room using a model of an energy system to be installed in the room, said energy system having an energy source, said room having at least one desired three dimensional object therein and being defined by three dimensional coordinates, said apparatus comprising:

input means for inputting three dimensional coordinates relating to the room to be analyzed including position coordinates of a surface of three dimensional object within the room and for inputting a designated location for the energy source;

memory for storing the inputted three dimensional coordinates relating to the room, the surface of the object therein and the energy source; and processing means, coupled to the memory, including:

zenithal angle means for defining a spherical surface around the energy source, for dividing the spherical surface at regular intervals for modeling uniform energy line emission from the energy source, for determining a zenithal angle, and then for storing the determined zenithal angle in the memory;

horizontal angle dividing number means for determining a horizontal angle dividing number of the spherical surface in correspondence with the stored zenithal angle;

horizontal angle calculating means for determining a horizontal angle using the horizontal angle dividing number, and then for storing the determined horizontal angle in the memory;

emission intensity calculating means for determining an intensity in correspondence with the determined horizontal angle;

arrival surface detecting means for simulating the emission, from the center of the spherical surface, of energy lines each of which passes through a point defined by the determined zenithal and horizontal angles and has the determined intensity, and then for determining, based on the three dimensional coordinates relating to the room and the surface of the object therein, a surface at which the emitted energy line arrives;

intensity adding means for adding to each other the intensity of energy of the energy line for each solid surface at which the energy line arrives; and geometrical view factor determining means for determining a ratio of the entire emitted energy from the energy source and arrival intensity after simulated emission of all of the energy lines, and then for setting the ratio as the geometrical view factor and storing it in the memory.

4. The apparatus as claimed in claim 3, wherein the spherical surface is a hemispherical surface.

* * * * *

UNITED STATES PATENT AND TRADE MARK OFFICE
CERTIFICATE OF CORRECTION

PATENT NO.    : 5,546,327
DATED         : August 13, 1996
INVENTOR(S)   : Yoshihiro Hattori et al.

It is certified that error appears in the above-identified patent and that said Letters Patent is hereby corrected as shown below:

Column 16, claim 1, line 46, after "line" delete --arrived--.

Signed and Sealed this

Third Day of March, 1998

*Attest:*

BRUCE LEHMAN

*Attesting Officer*    Commissioner of Patents and Trademarks